United States Patent
Suzuki

(10) Patent No.: US 6,314,548 B1
(45) Date of Patent: Nov. 6, 2001

(54) AUTOMATIC MAXIMUM THEORETICAL YIELD CALCULATING APPARATUS AND COMPUTER-READABLE RECORDING MEDIUM STORING PROGRAMS FOR AUTOMATIC MAXIMUM THEORETICAL YIELD CALCULATION WITH A COMPUTER

(75) Inventor: Keisuke Suzuki, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/275,783

(22) Filed: Mar. 25, 1999

(30) Foreign Application Priority Data

Mar. 26, 1998 (JP) .............................................. P10-078624

(51) Int. Cl.[7] ..................................................... G06P 17/50
(52) U.S. Cl. .................................. 716/11; 716/19; 438/14
(58) Field of Search ............................... 716/11; 11/4, 19; 438/14

(56) References Cited

U.S. PATENT DOCUMENTS

| | | | | |
|---|---|---|---|---|
| 5,438,527 | * | 8/1995 | Feldbaumer et al. | 716/19 |
| 5,719,796 | * | 2/1998 | Chen | 703/13 |
| 5,773,315 | * | 6/1998 | Jarvis | 438/14 |
| 5,966,312 | * | 10/1999 | Chen | 703/6 |
| 6,061,814 | * | 5/2000 | Sugasawara et al. | 714/724 |

OTHER PUBLICATIONS

Lee et al, "Advanced Yield Enhancement: Integrated Yield Analysis," IEEE Sep. 1997, pp. 67–75.*
Lee et al, "Yield Analysis And Data Management Using Yiel Manager," IEEE, Sep. 1998, pp. 19–30.*

* cited by examiner

Primary Examiner—Matthew Smith
Assistant Examiner—Vuthe Siek
(74) Attorney, Agent, or Firm—Ronald P. Kananen; Rader, Fishman & Grauer

(57) ABSTRACT

This apparatus can automatically calculate the specification of an exposing device which can automatically calculate the maximum theoretical yield of chips and realize chip manufacture with the minimum number of times of exposure by obtaining the chip layout producing the maximum number of chips from a wafer in the process to manufacture the chips from the wafer. This apparatus comprises initial data means, virtual chip layout calculating means, virtual chip layout storing means, maximum theoretical yield layout determining means, virtual exposure layout calculating means, virtual exposure layout storing means, minimum exposure layout determining means and determined layout displaying means. As explained above, it has been expected to provide an automatic maximum theoretical yield calculating apparatus to realize the maximum theoretical yield with the minimum number of times of exposure.

2 Claims, 23 Drawing Sheets

NOTCH TYPE WAFER (NOTE)
(Sx, Sy), (Sm, Sn), (Cx, Cy) HAVE THE FOLLOWING RELATIONSHIP
Sx = Cx × Sm
Sy = Cy × Sn

FIG. 4

MAXIMUM THEORETICAL YEILD LAYOUT CALCULATION SPECIFICATION INPUT

SELECTION OF WAFER SIZE (INCH) AND KIND OF WAFER
■ ORIENTATION ☐ NOTCH TYPE
FLAT TYPE

| ▶ 8 | 4 | 5 | 6 | 8 | 12 |
|---|---|---|---|---|---|

WAFER EFFECTIVE AREA SPECIFICATION
☐ WIDTH OF NON-EFFECTIVE AREA AROUND THE WAFER
☐ WIDTH OF NON-EFFECTIVE AREA IN THE WAFER
ORIENTATION FLAT SIDE

CHIP SIZE INPUT
☐ Cx (μm)
☐ Cy (μm)

NUMBER OF CHIPS PER SINGLE EXPOSURE
☐ Sm : NUMBER OF CHIPS PER SINGLE EXPOSURE IN THE X DIRECTION
☐ Sn : NUMBER OF CHIPS PER SINGLE EXPOSURE IN THE Y DIRECTION

FIG. 5

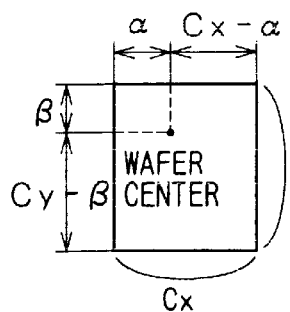

Cx: CHIP SIZE IN THE X DIRECTION
Cy: CHIP SIZE IN THE Y DIRECTION
α: DISTANCE IN THE X DIRECTION BETWEEN THE CHIP UPPER LEFT CORNER AND WAFER CENTER
β: DISTANCE IN THE Y DIRECTION BETWEEN THE CHIP UPPER LEFT CORNER AND WAFER CENTER

FIG. 6

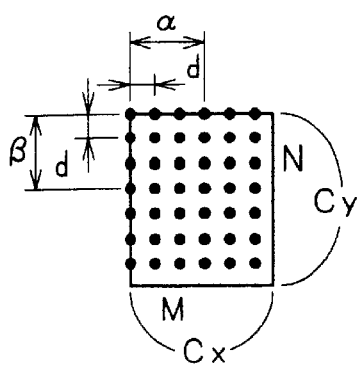

$$M = \left(\frac{Cx}{d}\right)$$

$$N = \left(\frac{Cy}{d}\right)$$

[A] INTEGER NOT EXCEEDING A
$\alpha = d \times m \ (0 \leq m < M)$
$\beta = d \times n \ (0 \leq n < N)$

WAFER CENTER = COORDINATES OF ORIGIN

FIG. 11

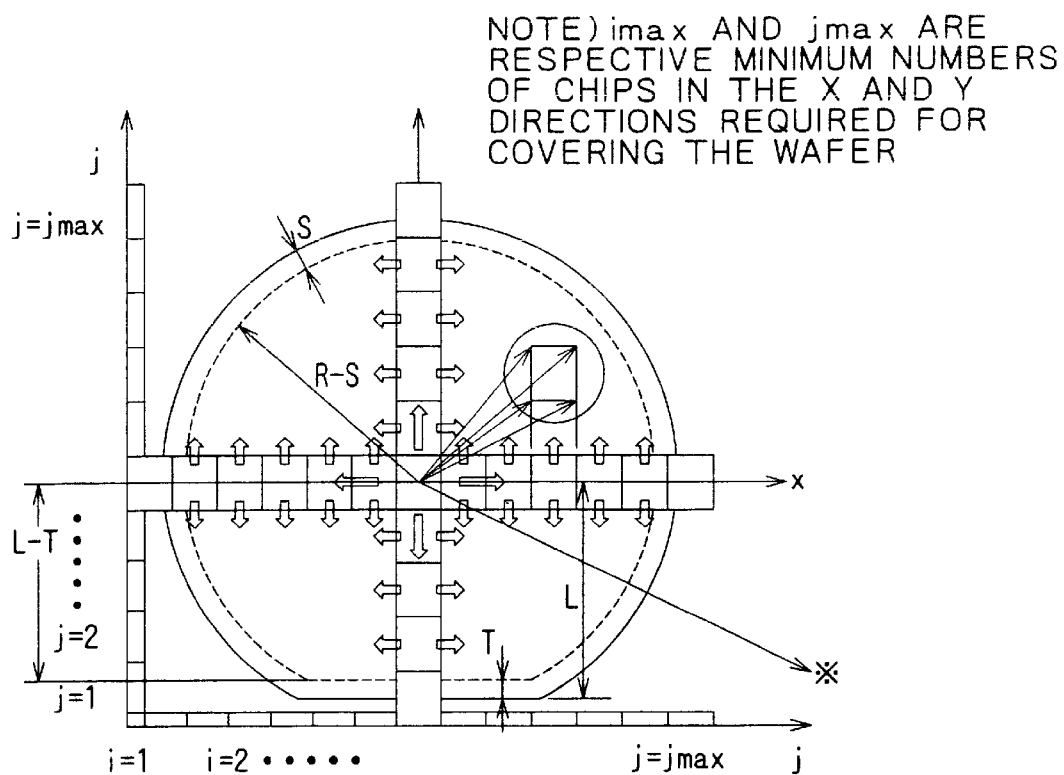

NOTE) imax AND jmax ARE RESPECTIVE MINIMUM NUMBERS OF CHIPS IN THE X AND Y DIRECTIONS REQUIRED FOR COVERING THE WAFER ※ WHEN THE CHIP POSITION INCLUDING THE CHIP CENTER IS FIXED, THE CHIP LAYOUT CAN BE DETERMINED UNIQUELY BY ARRANGING THE CHIPS IN THE X AND Y DIRECTIONS WITH REFERENCE TO THIS CHIP.

THE THEORETICAL YIELD IS DETERMINED BY THE NUMBER OF CHIPS WHERE THE DISTANCE BETWEEN THE FOUR CORNERS OF EACH CHIP AND THE WAFER CENTER IS WITHIN THE EFFECTIVE AREA RANGE.

FIG.15

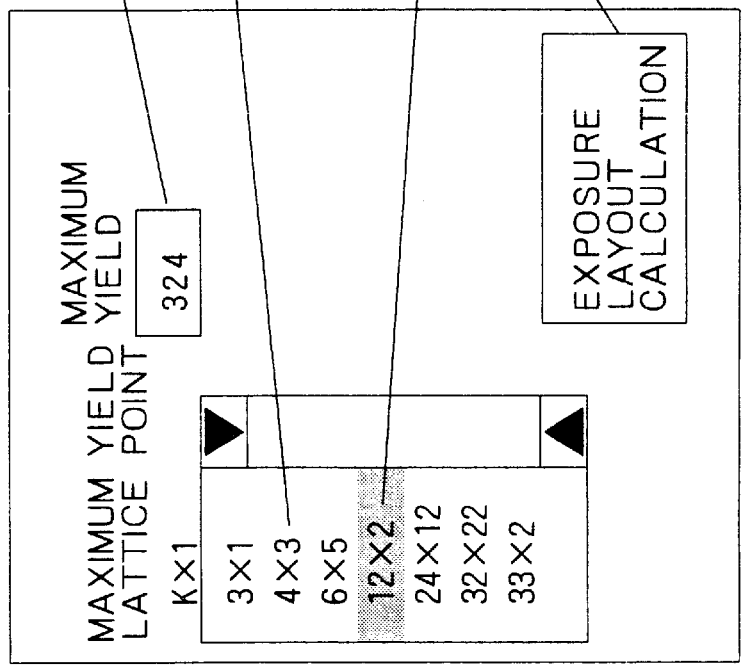

MAXIMUM VALUE AMONG THE THEORETICAL YIELD CORRESPONDING TO EACH LATTICE POINT

DISPLAYING THE COORDINATES k,l OF THE LATTICE POINT OF FIG. 14 PROVIDING THE MAXIMUM THEORETICAL YIELD

SELECTING THE COORDINATES OF DESIRED LATTICE POINT PROVIDING THE MAXIMUM THEORETICAL YIELD

BUTTON SWITCH FOR SHIFTING TO THE NEXT PROCESS

※ COMBINATION OF (k,l) DETERMINED BY THE SELECTION IMAGE IS STORED AS (ko, lo) AND SIMULTANEOUSLY THE MAXIMUM THEORETICAL YIELD IS STORED AS Rmax.

MAXIMUM THEORETICAL YIELD CHIP LAYOUT

→ CHIPS (3×2) ARE ARRANGED PER SINGLE EXPOSURE

1) MATCHED WITH THE CHIP IN THE ORIENTATION FLAT AREA SIDE

2) LEFT SIDE IS MATCHED WITH THE EXTREME LEFT SIDE CHIP

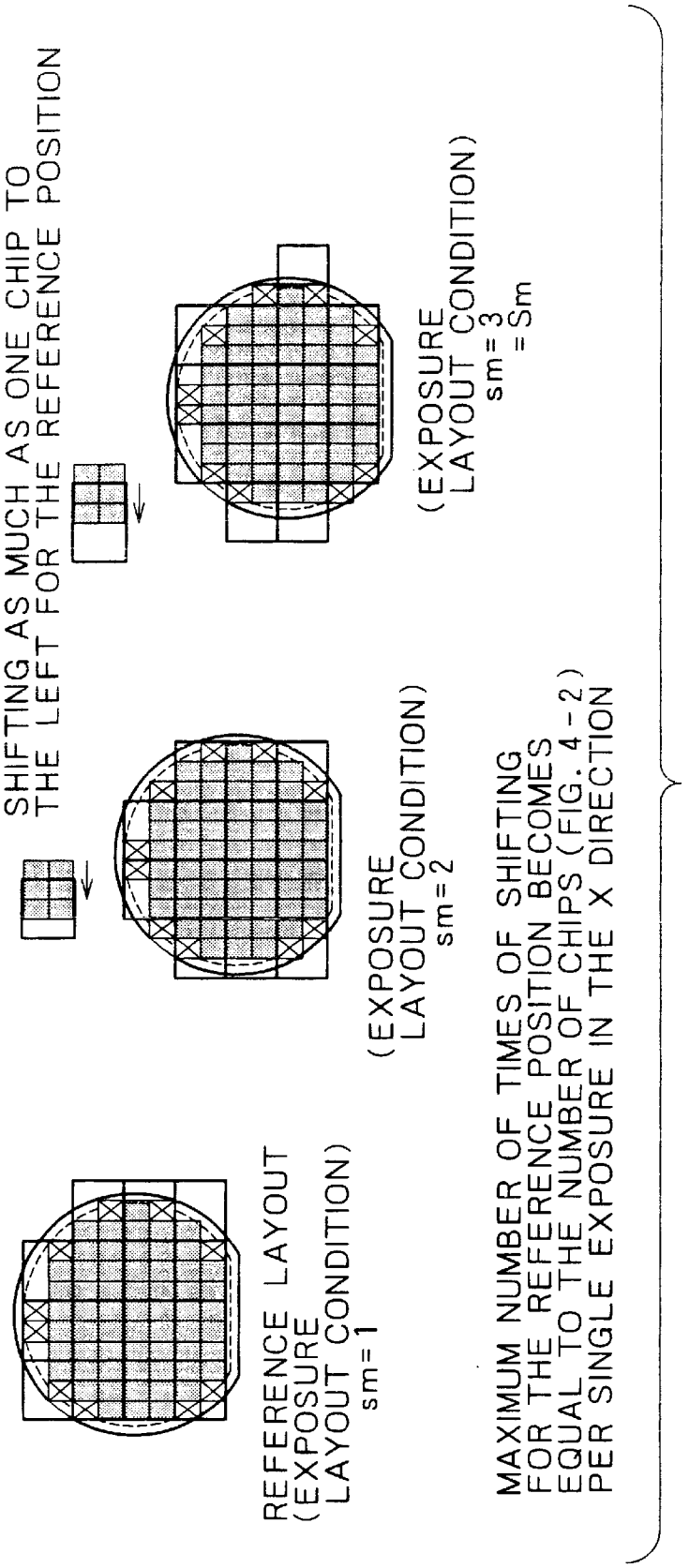

FIG. 18

START

↓

CALUCULATION OF INITIAL DATA
- DEFINE WAFER CENTER AS THE ORIGIN OF X,Y COORDINATES
- POSITION OF CHIP INCLUDING THE CENTER BECOMES THE POSITION PROVIDING THE DETERMINED MAXIMUM THEORETICAL YIELD
- CALCULATE THE NUMBER OF EFFECTIVE CHIPS ON THE X,Y COORDINATE AXES AND OBTAIN ITS MAXIMUM AND MINIMUM COORDINATE VALUES $Xc\_min = [-\{(R-S) - \alpha\} / Xc]$
$Xc\_max = [\{(R-S) - (Cx - \alpha)\} / Xc]$
$Yc\_min = [-\{(R-S) - \beta\} / Yc]$
$Yc\_max = [\{(R-S) - (Cy - \beta)\} / Yc]$
   [A]: MAXIMUM INTEGER NOT EXCEEDING A

↓

SETTING OF POSITION FOR REFERENCE EXPOSURE
- ASSUME THAT THERE IS THE LEFT LOWER CORNER OF THE EXPOSING AREA AT (Xc_min, Yc_min) AND DEFINE ITS EXPOSURE AS THE REFERENCE EXPOSING AREA
- WHEN THE REFERENCE EXPOSING AREA IS DEFINED AS EXPOSURE LAYOUT (s, t) = (1, 1) OBTAIN THE MAXIMUM VALUE (smax, tmax) OF THE EXPOSURE LAYOUT COVERING THE EFFECTIVE CHIP $tmax = [(Xc\_max - Xc\_min) / Sx] + 1$
$smax = [(Yc\_max - Yc\_min) / Sy] + 1$
   [A]: MAXIMUM INTEGER NOT EXCEEDING A

↓

INITIALIZATION OF COORDINATES OF FOUR CORNERS OF EXPOSURE
PS1 = (Xc_min, Yc_min)
PS2 = (Xc_min + Sx, Yc_min)
PS3 = (Xc_min + Sx, Yc_min + Sy)
PS4 = (Xc_min, Yc_min + Sy)

sm = 1: EXPOSURE LAYOUT CONDITION INITIALIZATION

← (A)

Sn = 0: EXPOSURE NUMBER COUNTER INITIALIZATION

↓

INITIALIZATION OF EXPOSING POSITION SHIFT

↓ fs = 0: FLAG FOR DETERMINING THE EFFECTIVE CHIPS IN THE EXPOSING RANGE

↓

INITIALIZATION OF COORDINATES OF FOUR CORNERS OF CHIP WITHIN THE EXPOSING AREA
PC1 = (PS1(x), PS1(y))
PC2 = (PS1(x) + Cx, PS1(y))
PC3 = (PS1(x) + Cx, PS1(y) + Cy)
PC4 = (PS1(x), PS1(y) Cy)

PS1(x), PS1(u): COORDINATE VALUES OF X,Y OF PS1

↓ (C)

(B)

F I G. 21
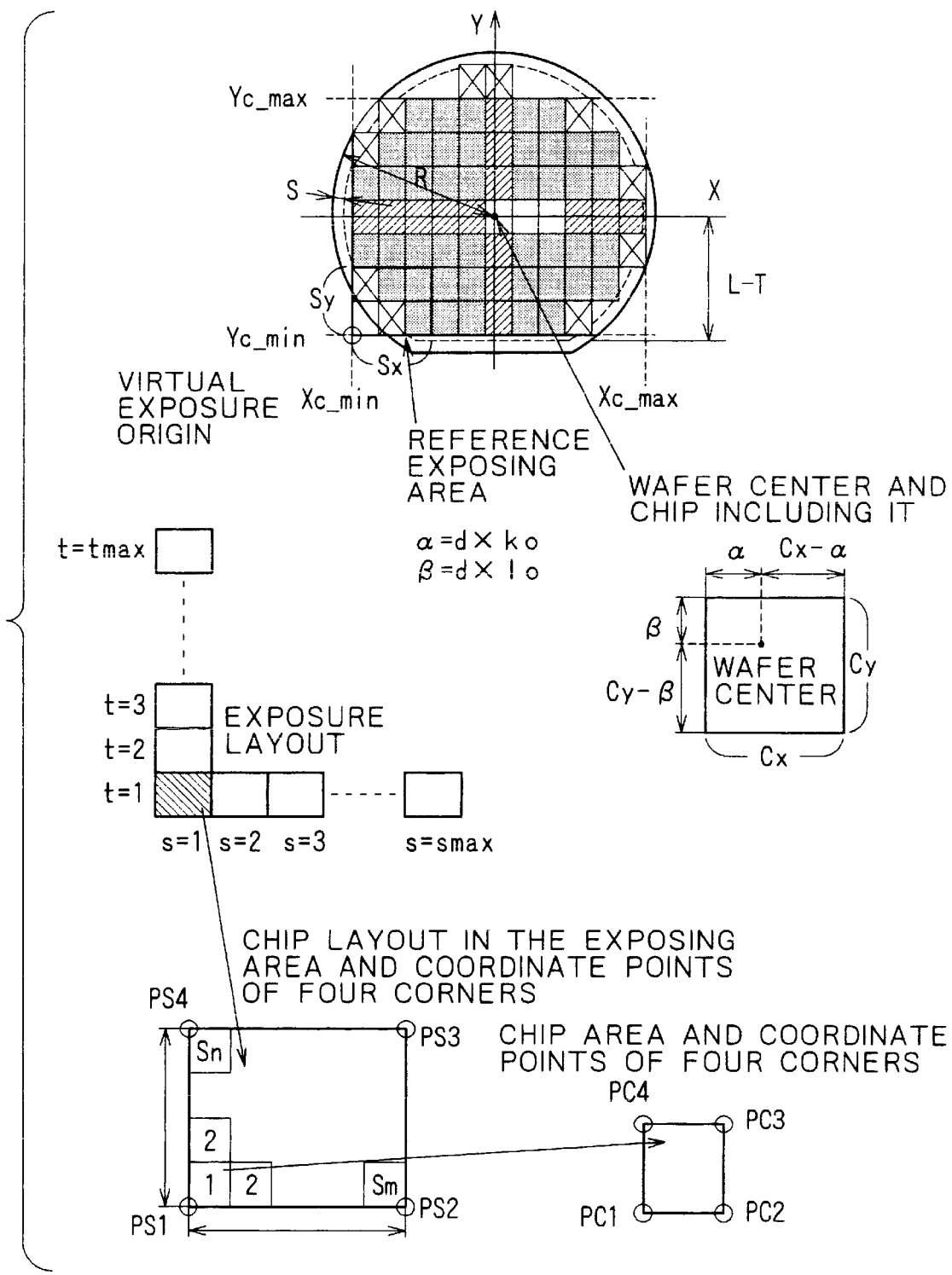

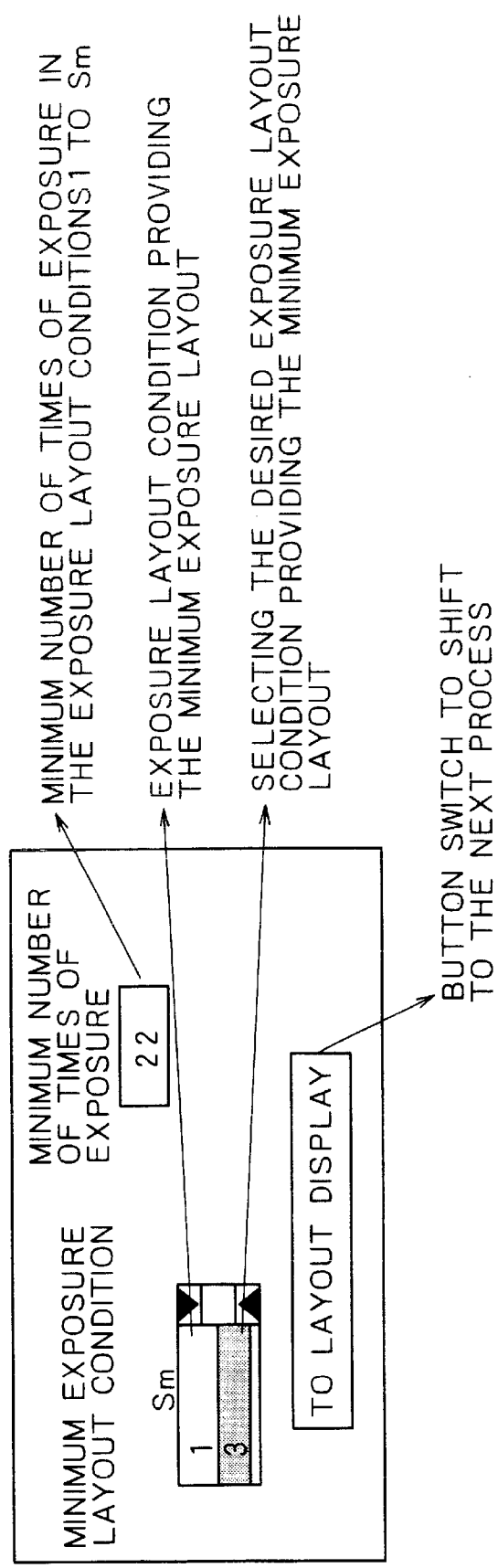

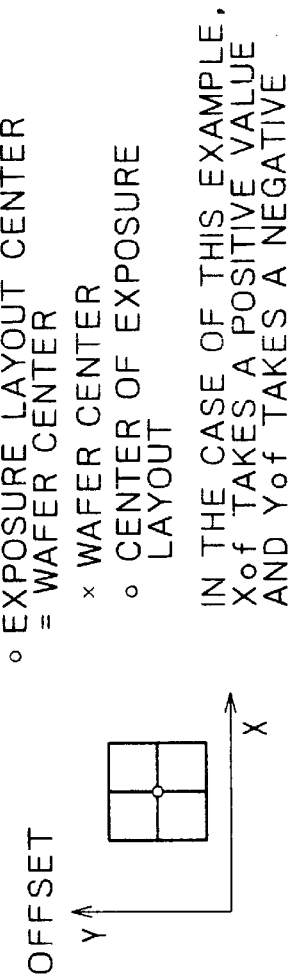
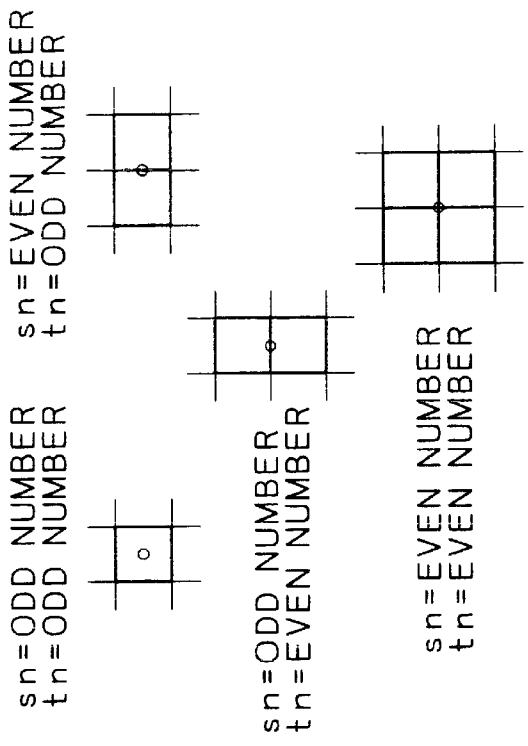
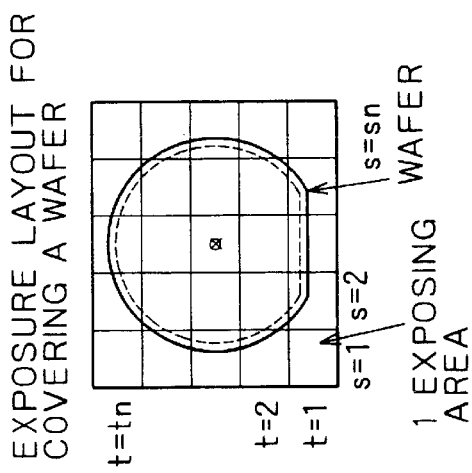

FIG. 26

Computer Ridet Map of water (CAMP)

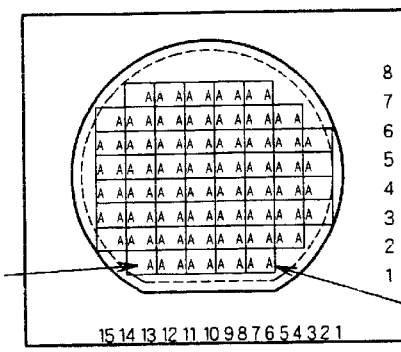

CHARACTER 'A' INDICATES EFFECTIVE CHIPS

ONE FRAME IS ONE EXPOSING AREA

```
Device TYPE: CXDXXXX   WAFER SIZE
Size    =    5    [inch]
Xchip   =    7.00 [mm]      CHIP SIZE Cx
Ychip   =   12.50 [mm]                Cy
Xchip_C =   15
Ychip_R =    8
```

NSR MAP DATA

| RISHU = 104 | MAXIMUM YIELD |

Xoffset = +3500 [um]     ◎ EXPOSING DEVICE OFFSET
Yoffset =     0 [um]

Number of SHOT = 56      NUMBER OF TIMES OF EXPOSURE

ShatX_C = 8              ◎ EXPOSURE LAYOUT
ShatY_R = 8                 MAXIMUM VALUE 2×1 on Reticle           CHIP LAYOUT WITHIN THE EXPOSING RANGE Xshot = 14000 [um]       ◎ EXPOSING SIZE  Sx
Yshot = 12500 [um]                         Sy

◎ SPECIFICATION REQUIRED FOR EXPOSING DEVICE

THEORETICAL YIELD 61
NUMBER OF TIMES OF EXPOSURE 21

THEORETICAL YIELD 61
NUMBER OF TIMES OF EXPOSURE 19

☐ EXPOSING AREA
▦ CHIPS WITHIN THE EFFECTIVE AREA
☒ CHIPS WITHIN THE NON-EFFECTIVE AREA

US 6,314,548 B1

AUTOMATIC MAXIMUM THEORETICAL YIELD CALCULATING APPARATUS AND COMPUTER-READABLE RECORDING MEDIUM STORING PROGRAMS FOR AUTOMATIC MAXIMUM THEORETICAL YIELD CALCULATION WITH A COMPUTER

BACKGROUND OF THE INVENTION

1. Field of the Invention

The present invention relates to an automatic maximum theoretical yield calculating apparatus for obtaining chip layout for producing the maximum number of chips from a wafer at the time of producing chips from a wafer, automatically calculating the maximum theoretical yield of chips and also automatically calculating specifications of an exposing device to realize production of chips with the minimum number of times of exposure and a computer-readable recording medium storing programs to execute automatic calculation of maximum theoretical yield with a computer.

2. Description of the Related Art

It is very effective, in manufacture of semiconductor devices, for cost reduction of products to design the layout of chips on the wafer to obtain the maximum number of chips in view of obtaining the theoretical maximum number of chips from a sheet of wafer and obtain the so-called maximum theoretical yield through the manufacture under the design explained above. It is because the manufacturing unit price per chip or product can be lowered by increasing the number of chips per water, namely raising the yield, since wafer cost is generally not different to a large extent in the same manufacturing method in the single line.

For example, when chip layout in the area effective to manufacture i.e. the effective range of a wafer aiming at the theoretical yield of fifty-eight as shown in FIG. 27A is compared with the chip layout aiming at the theoretical yield of sixty-one as shown in FIG. 27B, the latter layout is apparently advantageous from the viewpoint of manufacturing cost.

A method of obtaining such maximum theoretical yield is disclosed, for example, in the Japanese Published Unexamined Patent Application No. Sho 63-250811 entitled as "Semiconductor Wafer".

However, in this Japanese Published Unexamined Patent Application No. Sho 63-250811, a calculation example for determining the chip layout on a wafer to obtain the maximum number of chips, namely the maximum theoretical number of chips is disclosed but it is difficult to apply this calculation result to the actual wafer manufacturing process.

It is because chip layout is determined by a semiconductor exposing device such as a stepper, and so forth in the actual wafer manufacturing process and therefore layout for assuring the maximum theoretical yield cannot be realized unless various specifications for determining the exposing layout by the semiconductor exposing device are automatically provided in the chip layout for obtaining the maximum theoretical yield.

In other words, in the wafer manufacturing process, a plurality of chips are generally grouped by a sheet of mask and these chips are exposed on the wafer under this condition with a wiring pattern printing device which is called a semiconductor exposing device. In this timing, since the semiconductor manufacturing line is required to raise productivity per a short period of time, it is a very important factor for improvement of the productivity, in the layout for obtaining the same theoretical yield, how to reduce the number of times of exposing process for the layout of chips.

For example, when the theoretical yield is sixty-one as shown in FIG. 28A and FIG. 28B, the layout shown in FIG. 28B in which the number of times of exposing process is nineteen is apparently more advantageous in the point of view of manufacturing cost than the layout shown in FIG. 28A in which the number of times of exposing process is twenty-one.

However, the method to realize the minimum number of times of exposing process assuring the maximum theoretical yield is not yet proposed.

SUMMARY OF THE INVENTION

With the background explained previously, the present invention has been proposed to provide an automatic maximum theoretical yield calculating apparatus to realize the minimum number of times of exposing process with the maximum theoretical yield and a computer-readable recording medium storing a program to execute automatic calculation for the maximum theoretical yield with a computer.

The automatic maximum theoretical yield calculating apparatus of the present invention is provided with the means for solving the subject of the related art explained above comprising:

initial data means including a wafer shape specification storing function, wafer effective area specification input/storing function, chip size specification input/storing function and exposing size specification input/storing function;

virtual chip layout calculating means;

virtual chip layout storing means;

maximum theoretical yield layout determining means including the maximum theoretical yield condition retrieving function and maximum theoretical yield condition selecting means;

virtual exposure layout calculating means including an exposure layout calculating function and an exposing number calculating function;

virtual exposure layout storing means;

minimum exposure layout determining means including a minimum exposure number condition retrieving function and a minimum exposure number condition selecting function; and determined layout displaying means including determined layout displaying function and an exposing device specification displaying function.

In this automatic maximum theoretical yield calculating apparatus, a specification for determining the shape of a wafer in a plurality of sizes is stored first by the wafer shape specification storing function in the initial data means, an input specification is then stored when the specification is an input to determine the shape of an effective area to determine the chip manufacturing range on the wafer by the wafer effective area specification input/storing function, an input specification is then stored when the specification is input to determine the size of the chips to be arranged by the chip size specification input/storing function and input specification is stored when the specification is input to determine the range of a single exposing process and the number of chips within this range by the exposure size specification input/storing function.

Next, in the virtual chip layout calculating means, calculation is conducted, by the chip layout calculating function, for determining virtual chip layout in the effective area, under the condition of chip layout depending on a plurality of relative positions of the wafer center and the chip including this wafer center, based on the wafer shape and shape of the effective area obtained from the specification for determining the shape of wafer and the specification for determining the shape of effective area stored in the initial data means and the number of chips providing the theoretical yield in the effective area of the chip layout is calculated by the chip layout calculating function.

Next, in the virtual chip layout storing means, chip layout condition depending on a plurality of relative positions of the wafer center and the chip including such wafer center and theoretical yield obtained by the theoretical yield calculating function based on such condition are stored.

Next, in the maximum theoretical yield layout determining means, a layout condition assuring the maximum theoretical yield is retrieved from the theoretical yield stored in the virtual chip layout storing means obtained by the virtual chip layout calculating means and is then stored by the maximum theoretical yield condition retrieving function and the desired condition is selected from a plurality of layout conditions, when these are existing, which provide the maximum theoretical yield retrieved and stored by the maximum theoretical yield condition selecting means.

Next, in the virtual exposure layout calculating means, the exposure layout condition for the virtual exposure of the wafer by the semiconductor exposing device is calculated under the layout condition which provides the maximum theoretical yield selected by the maximum theoretical yield condition selecting function in the maximum theoretical yield layout determining means by the exposure layout calculating function and the number of times of exposing process is calculated for the exposure layout condition obtained by the exposure number calculating function.

Next, in the virtual exposure layout storing means, the exposure layout condition obtained by the exposure layout calculating function and the number of times of exposing process obtained by the exposure number calculating function are stored.

Next, in the minimum exposure layout determining means, a condition providing the minimum number of times of exposing process is retrieved from the exposure layout condition which is obtained in the virtual exposure layout calculating means by the minimum exposure number condition retrieving function and is stored in the virtual exposure layout storing means and is then stored, and the desired condition is selected from a plurality of exposure layout conditions, when these are existing, which provide the minimum exposure number retrieved and stored by the minimum exposure number condition selecting function.

Thereafter, in the determined layout displaying means, the layout overlapping the chip layout providing the maximum theoretical yield selected and determined in the maximum theoretical yield layout determining means and minimum exposure layout determining means by the determined layout a displaying function and the exposure layout providing the minimum exposure number is determined and displayed and specification data required for actually reproducing the chip layout determined by the exposing device specification displaying function with the exposing device is displayed.

Therefore, the automatic maximum theoretical yield calculating apparatus obtains, on the basis of the operations explained above, the chip layout which can obtain the maximum number of chips from the wafer on the occasion of producing the chips from the wafer to conduct automatic calculation of maximum theoretical yield of chip and also can conduct the automatic calculation for the specification of an exposing device which can produce chips with the minimum number of times of exposing process.

Moreover, the computer-readable recording medium storing a program for executing automatic calculation of the maximum theoretical yield with a computer of the present invention provides the means for solving the subject explained above by comprising:

initial data processing means for wafer shape specification storing process, wafer effective area specification input/storing process, chip size specification input/storing process and exposure size specification input/storing process;

virtual chip layout calculation processing means for chip layout calculating process and theoretical yield calculating process;

virtual chip layout storage processing means;

maximum theoretical yield layout determination processing means for maximum theoretical yield condition retrieving process and maximum theoretical yield condition selecting process;

virtual exposure layout calculation processing means for exposure layout calculation process and exposure number calculation process;

virtual exposure layout storage processing means;

minimum exposure layout determination processing means for a minimum exposure number condition retrieving process and a minimum exposure number condition selecting process; and determined layout display processing means for a determined layout display process and exposing device specification display process.

Regarding this recording medium, in the initial data processing means, the specification for determining wafer shape in a plurality of sizes is stored by the wafer shape specification storing process, the input specification is stored when it is input to determine the shape of an effective area for determining the chip manufacturing range on the wafer by the wafer effective area specification input/storing process, the input specification is stored when it is input to determine the size of chips arranged by the chip size specification input/storing process and the input specification is stored when it is input to determine the size of an single exposing range and the number of chips in this range by the exposure size specification input/storing process.

Next, in the virtual chip layout calculation processing means, calculation to determine the virtual chip layout in the effective area is conducted under the condition of the chip layout depending on a plurality of relative positions between the wafer center and chip including this wafer center based on the wafer shape and shape of effective area obtained from the specification to determine the wafer shape stored in the initial data means by the chip layout calculation process and the specification to determine the shape of effective area and then the number of chips providing the theoretical yield arranged in the effective area in the chip layout obtained by the chip layout calculation process is then calculated by the theoretical yield calculation process.

Next, in the virtual chip layout storage processing means, a chip layout condition depending on a plurality of relative positions of the wafer center and the chip including this wafer center and the theoretical yield obtained by the theoretical yield calculation process based on this condition are stored.

Subsequently, in the maximum theoretical yield layout determination processing means, the layout condition assuring the maximum theoretical yield is retrieved, by the maximum theoretical yield condition retrieving process, from the theoretical yield obtained by the virtual chip layout calculation processing means and is then stored in the virtual chip layout storage processing means and is then stored, and the desired layout condition is selected from a plurality of layout conditions, when these are existing, which assure the maximum theoretical yield retrieved and stored by the maximum theoretical yield condition selection process.

Next, in the virtual exposure layout calculation processing means, the exposure layout condition in such a case that the wafer is virtually exposed by the semiconductor exposing device is calculated by the exposure layout calculation process under the layout condition which assures the maximum theoretical yield selected by the maximum theoretical yield condition selection process in the maximum theoretical yield layout determination processing means and the number of times of the exposure is calculated for the exposure layout condition obtained by the exposure number calculating process.

Next, in the virtual exposure layout storage processing means, the exposure layout condition obtained by the exposure layout calculation process and the exposure number obtained by the exposure number calculation process for such condition are stored.

Subsequently, in the minimum exposure layout determination processing means, the condition assuring the minimum number of times of exposure is retrieved from the exposure layout conditions obtained by the virtual exposure layout calculation processing means and is stored by the virtual exposure layout storage processing means and is then stored by the minimum exposure number condition retrieving process and the desired condition is selected from a plurality of exposure layout conditions, when these are existing, assuring the minimum exposure number retrieved and stored by the minimum exposure number condition selecting process.

Thereafter, in the determined layout display processing means, the layout diagram overlapping the chip layout assuring the maximum theoretical yield determined by the maximum theoretical yield layout determination processing means and the minimum exposure layout determination processing means and the exposure layout assuring the minimum exposure number is determined and displayed by the determined layout display process and then the specification data required for reproducing, with the actual exposing device, the chip layout determined by the exposing device specification display process is displayed.

Therefore, according to the operations explained above, regarding the recording medium of the present invention, a chip layout for obtaining the maximum number of chips from a wafer is obtained to produce the chips from the wafer for the automatic calculation of the maximum theoretical yield of chips and specification of the exposing device for realizing manufacture of chips with the minimum number of times of exposure can be calculated automatically.

BRIEF DESCRIPTION OF THE DRAWINGS

FIG. 4 is a diagram showing an example of the specification input GUI format.

FIG. 5 is a diagram showing a relationship between wafer center and a chip including this wafer center.

FIG. 6 is a diagram showing the condition that the wafer center is located at the lattice point in the chip.

FIG. 11 is a diagram for explaining another example of the yield calculation method.

FIG. 15 is a diagram showing an interface image of a maximum theoretical yield layout determining means.

FIG. 16A shows an example of the maximum theoretical yield chip layout and FIG. 16B shows an example of the exposure layout condition with reference to the orientation flat area.

FIG. 17 is a diagram showing examples of exposure layout in the virtual exposure layout calculating means.

FIG. 18 is a flowchart for exposure number calculation of a plurality of exposure layouts in the virtual exposure layout calculating means and is also a diagram for explaining initialization of exposure number calculation.

FIG. 21 is a diagram for explaining the symbols (specifications) used for the calculation in the flowcharts shown in FIG. 18, FIG. 19 and FIG. 20.

FIG. 22 is a diagram showing an input interface image of the minimum exposure layout determining means.

FIGS. 23A, 23B, 23C are diagrams for explaining specifications required for an ordinary exposing apparatus.

FIG. 26 is a diagram showing an output example of the calculation result of the maximum theoretical yield/minimum exposure number layout.

DESCRIPTION OF THE PREFERRED EMBODIMENT

The present invention will be explained below in detail.

Figure 1:
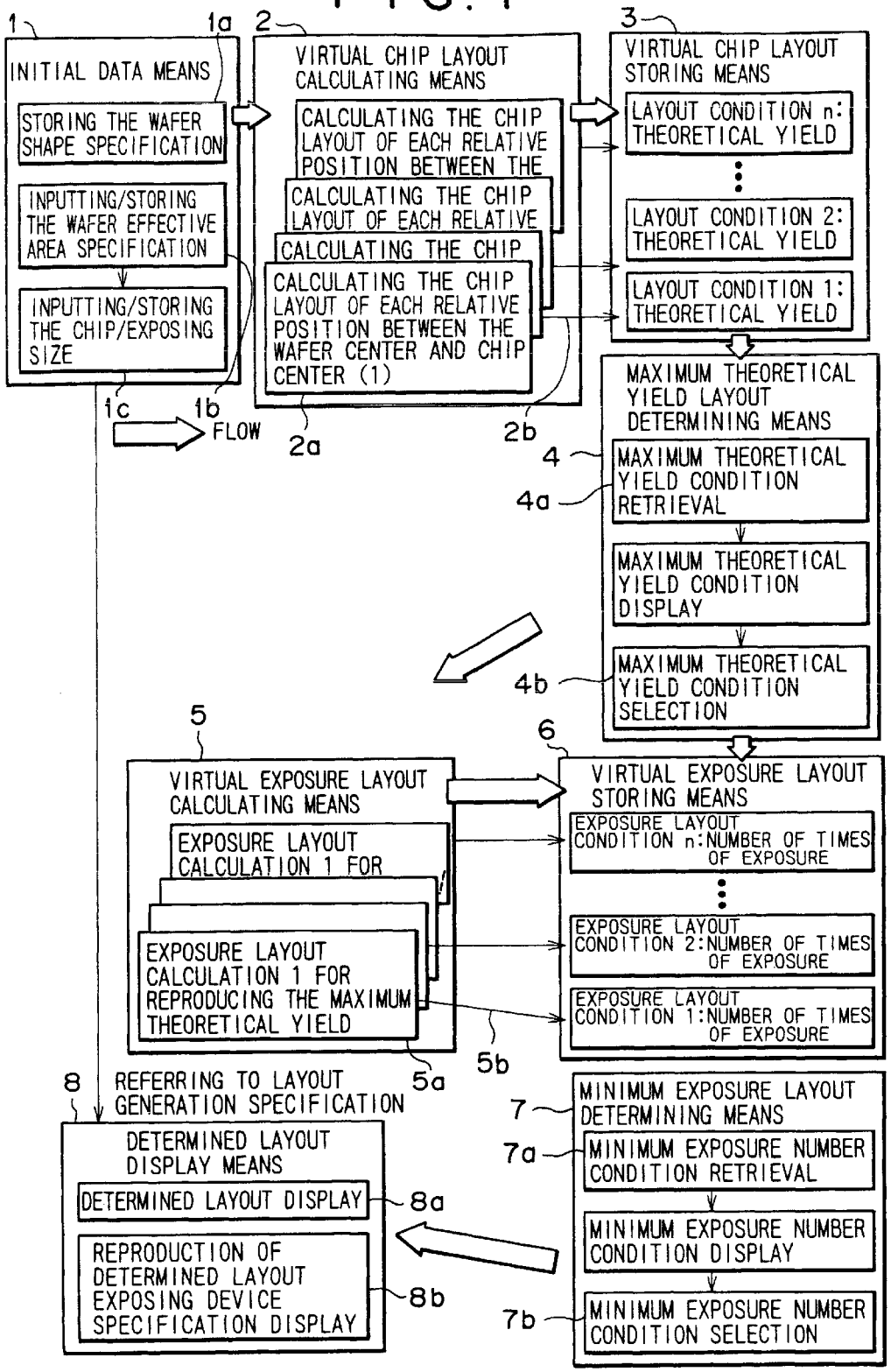
FIG. 1 is a block diagram showing a preferred embodiment of an automatic maximum theoretical yield calculating apparatus and is also a diagram for explaining the process flow of this automatic calculating apparatus.

FIG. 1 is a diagram showing an embodiment of an automatic maximum theoretical yield calculating apparatus of the present invention. This automatic calculating apparatus outputs and displays the specifications and layout diagram for setting the exposure layout to realize the maximum theoretical yield layout with the minimum exposure number.

Namely, this automatic calculating apparatus is designed as the apparatus for automatically calculating specifications of an exposing device which can automatically calculate the maximum theoretical yield of chips by obtaining the chip layout for producing the maximum number of chips from the wafer to produce the chips from wafer and can realize manufacture of chips with the minimum number of times of exposure. This automatic calculating apparatus comprises an initial data means 1, a virtual chip layout calculating means 2, a virtual chip layout storing means 3, a maximum theoretical yield layout determining means 4, a virtual exposure layout calculating means 5, a virtual exposure layout storing means 6, a minimum exposure layout determining means 7 and a determined layout displaying means 8. In FIG. 1 and the subsequent drawings, the term "wafer" is used in the same meaning.

The initial data means 1 is composed of a wafer shape specification storing a function 1a for storing specification to determine the shape of wafer in a plurality of sizes, a wafer effective area specification input/storing function 1b for storing the input specification when the specification to determine the shape of effective area for determining the chip manufacturing range on the wafer and a chip/exposure size inputting/storing function 1c consisting of the chip size inputting/storing function for storing the input specification when the specification to determine the size of chips to be arranged is input and the exposure size specification inputting/storing function for storing the input specification when the specification to determine the size of single exposure range and the number of chips to be arranged within this range is input.

The virtual chip layout calculating means 2 is composed of the chip layout calculating function 2a for conducting the calculation to determine the virtual chip layout in the effective area under the condition of the chip layout depending on a plurality of relative positions between the wafer center and the chip including the wafer center based on the wafer shape and shape of effective area obtained from the specification to determine the shape of wafer stored in the initial data means and the specification for determining the shape of the effective area and the theoretical yield calculating function 2b for calculating the number of chips providing the theoretical yield arranged within the effective area regarding the chip layout obtained by the chip layout calculating function 2a.

The virtual chip layout storing means 3 is structured to store the chip layout condition depending on a plurality of relative positions between the wafer center and chip including such wafer center and the theoretical yield obtained by the theoretical yield calculating function 2b based on such chip layout condition.

The maximum theoretical yield layout determining means 4 is composed of the maximum theoretical yield condition retrieving function 4a for retrieving the layout condition to provide the maximum theoretical yield from the theoretical yield obtained by the virtual chip layout calculating means and stored in the virtual chip layout storing means and then storing this layout condition and the maximum theoretical yield condition selecting function 4b for selecting the desired condition from a plurality of layout conditions, when present, providing the maximum theoretical yield retrieved and stored.

The virtual exposure layout calculating means 5 is composed of the exposure layout calculating function 5a for calculating the exposure layout condition when the wafer is virtually exposed by the semiconductor exposing device under the layout condition providing the maximum theoretical yield selected by the maximum theoretical yield condition selecting function 4b in the maximum theoretical yield layout determining means 4 and the exposure number calculating function 5b for calculating number of times of exposure for the exposure layout condition obtained.

The virtual exposure layout storing means 6 is structured to store the exposure layout condition obtained by the exposure layout calculating function 5a and the exposure number obtained by the exposure number calculating function 5b for such exposure layout condition.

The minimum exposure layout determining means 7 is composed of the minimum exposure number condition retrieving function 7a for retrieving the minimum exposure number condition from exposure layout condition stored in the virtual exposure layout storing means 6 obtained by the virtual exposure layout calculating means 5 and then storing this exposure layout condition and the minimum exposure number condition selecting function 7b for selecting the desired condition from a plurality of exposure layout conditions, when these are existing, which provide the retrieved and stored minimum exposure number.

The determined layout displaying means 8 is composed of the determined layout displaying function 8a for determining and displaying the layout diagram obtained by overlapping the chip layout providing the maximum theoretical yield selected and determined by the maximum theoretical yield layout determining means 4 and minimum exposure layout determining means 7 and the exposure layout providing the minimum exposure number and the exposing device specification displaying function 8b for displaying specification data required to reproduce the determined chip layout with the actual exposing device.

Next, the layout of the chips on the wafer to obtain the maximum theoretical yield with the minimum number of times of exposure with the automatic calculating apparatus composed as explained above and the operation for outputting and displaying specifications of the exposing device required for reproduction of layout will be explained considering the layout of chips on the wafer having the orientation flat area as an example.

First, the specification for determining shape of wafers in a plurality of sizes is input to the program and stored therein by the wafer shape specification storing function 1a of the initial data means 1 as a process of the initial data processing means consisting of a series of processes.

Figure 2:
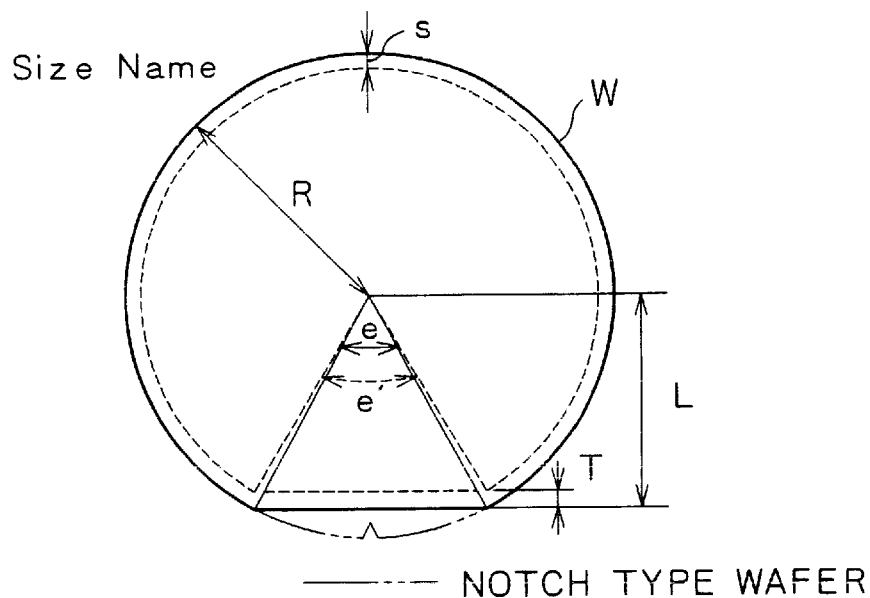
FIG. 2 is a diagram for explaining an example of the wafer shape specification.

As the wafer shape specification, data of the following items are practically stored in the wafer W shown in FIG. 2.

R: Wafer radius;

L: Distance up to the orientation flat area from the center (unnecessary in the case of notch type);

e: Angle formed by two intersecting points of the orientation flat area and circumference and the center (unnecessary in the case of notch type);

Size name: 8-inch, 6-inch, etc.

Moreover, in addition to these items, the specification for determining the shape of effective area or range to determine the chip or semiconductor product manufacturing range on the wafer is input by the wafer effective area specification inputting/storing function 1b and this input specification is also stored.

As the practical specification to determine the shape of wafer effective area, the data of following items is stored regarding the wafer W shown in FIG. 2.

S: Width of non-effective area around the wafer;

T: Width of non-effective area in the orientation flat area side (unnecessary in the case of notch type);

e: Angle formed by the intersecting point of the circumference of non-effective area and boundary of non-effective area in the orientation flat area side parallel to the orientation flat area.

Subsequently, the specification for determining a size of chip area of chips to be arranged is input by the chip/exposure size inputting/storing function 1c and moreover this input specification is stored. In addition, the specification for determining the size of a single exposure range and the number of chips within this range are then input and this input specification is also stored.

Figure 3:
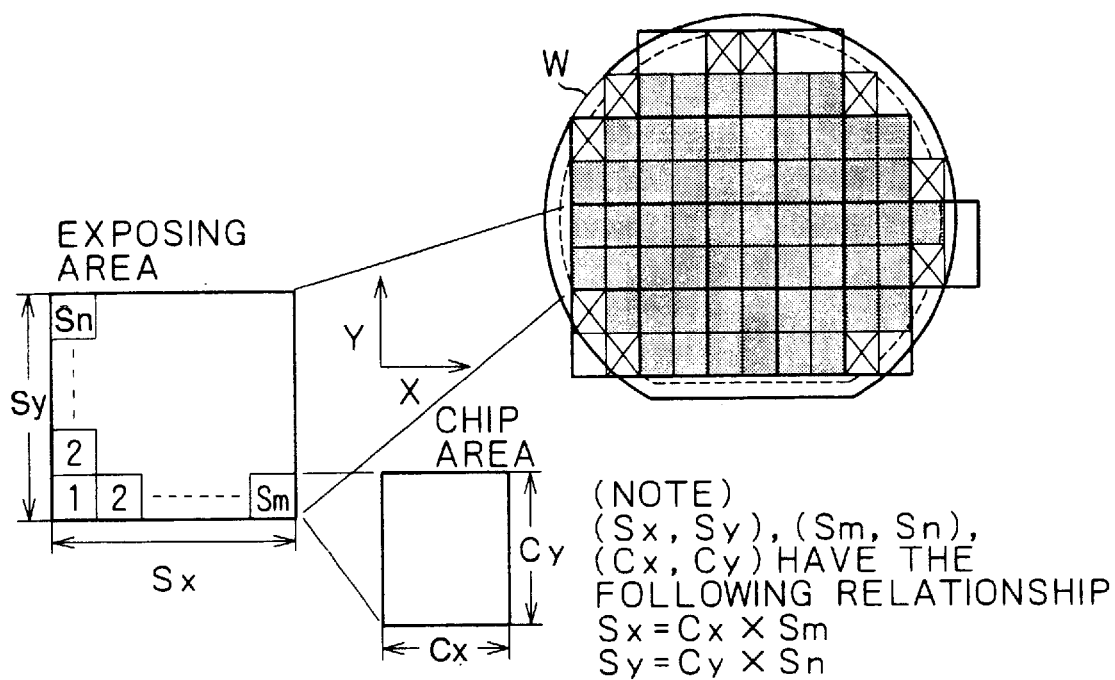
FIG. 3 is a diagram for explaining an example of the chip area specification.

As the practical specification of the chip area or chip size, the data of the following items is stored in regard to the wafer W shown in FIG. 3 and its partial enlarged view. Cx, Cy: Chip sizes respectively in the X and Y directions;

Moreover, as the practical specification of the exposing area i.e., the exposing size, the data of the following items are stored in FIG. 3.

Sx, Sy: Exposing sizes respectively in X, Y directions;

Sm, Sn: Number of chips respectively in X, Y directions in the exposing area;

Each input specification is summarized in the GUI format as shown in FIG. 4 and is then stored.

Next, as a process of the virtual chip layout calculation processing means consisting of a series of processes, the calculation for determining virtual chip layout in the effective area is conducted by the virtual chip layout calculating means 2 with the condition of chip layout depending on a plurality of relative positions between the wafer center and the chip including such wafer center, namely with reference to such relative positions on the basis of the wafer shape and shape of effective area obtained from the specification for determining the wafer shape stored in the initial data means 1 by the chip layout calculating function 2a and the specification for determining the shape of effective area.

Subsequently, the number of chips providing the theoretical yield arranged in the effective area in the chip layout obtained by the chip layout calculating function 2a is calculated by the theoretical yield calculating function 2b.

This calculation will explained practically. As shown in FIG. 5, relationship between the wafer center and the chip located at the position including the wafer center is expressed by two variables $\alpha$ and $\beta$ ($0 \leq \alpha < Cx$, $0 \leq \beta < Cy$).

d is assumed as a desired real number ($\Delta s < d < Cx$, $\Delta s < d < Cy$; $\Delta As$ is position accuracy of exposing device) and $\alpha = dxn$, $\alpha = dxm$ ($0 \leq m < M$, $0 \leq n < N$; m, n are integers; M, N are quotients obtained by dividing Cx, Cy with d>.

When d is set to the sufficiently smaller value, the condition that the wafer center is located on the point of the lattice M×N as shown in FIG. 6 can be indicated.

In general, when the relative position of wafer center and chip including this wafer center is determined, position of the wafer and chip layout is uniquely determined. Namely, one theoretical yield corresponds to one lattice point and the corresponding theoretical yield is calculated considering one lattice point as the chip layout condition by the chip layout calculating function 2a.

The theoretical yield of each lattice point indicating the relationship of the chip position including the wafer center generated for the desired d can be calculated by the various methods and only two examples of such calculation will be explained below.

CALCULATION EXAMPLE 1

(Calculation example based on the Japanese Published Unexamined Patent Application No. Sho 63-250811 entitled as "Semiconductor Wafer")

Figure 7:
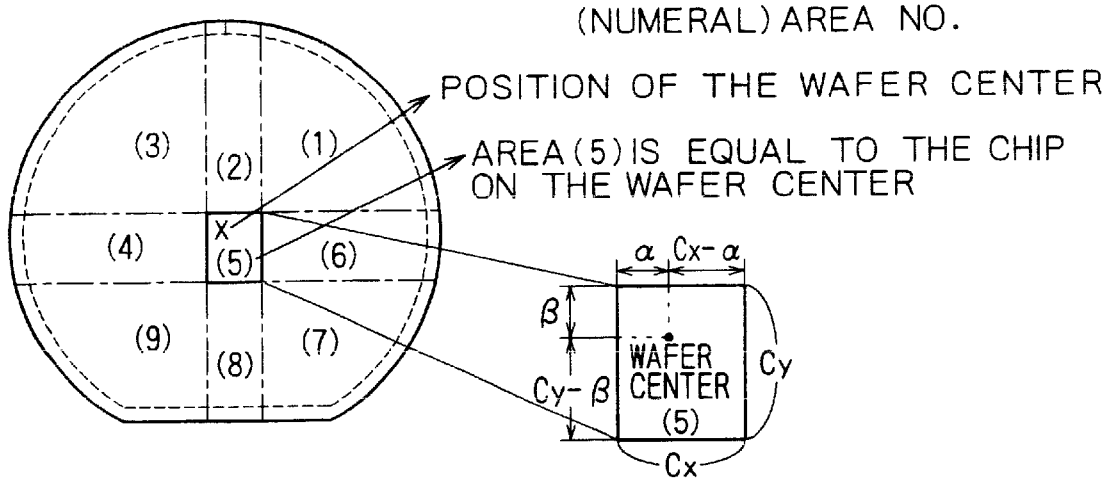
FIG. 7 is a diagram for explaining an example of a yield calculation method.

As shown in FIG. 7, the wafer effective area is divided to nine areas around the chip including the wafer center, the number of chips of each area is calculated and the total number of chips is obtained to calculate the theoretical yield.

As an example, the number of effective chips of the area (1) is calculated.

Figure 8:
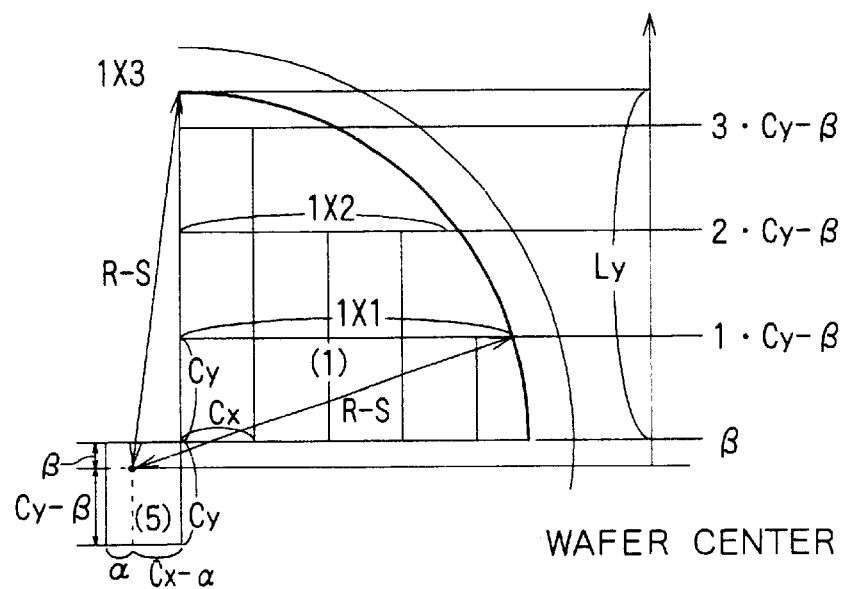
FIG. 8 is a diagram for explaining an example of yield calculation of the area (1) of FIG. 7.

① FIG. 8 shows the extracted area (1) and quotients obtained by dividing 1×1 to 1×3 with the chip size Cx are totaled to obtain the number of chips (n1 of the area (1).

② Generalization is conducted to ①.

$$n1 = \sum_{k=1}^{\mu} \left[ \frac{1 \times k}{Cx} \right] \tag{1}$$

[A] means the maximum integer not exceeding A.

$k = 1, 2, 3, \ldots, \mu$

Figure 9:
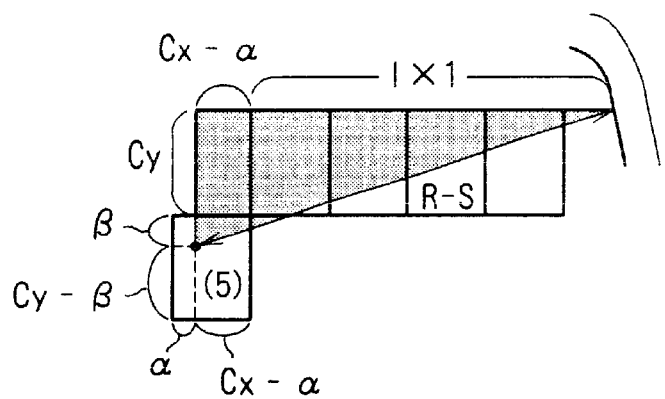
FIG. 9 is a diagram for explaining an example of yield calculation in the X direction in the area (1) of FIGS. 7 and 8.

③ Moreover, 1×k can be calculated as indicated below. FIG. 9 shows the case of 1×1.

$1 \times 1 = \sqrt{(R-S)^2 - (1 \cdot Cy + \beta)^2} - (Cx - \alpha)$ $= \sqrt{(R-S)^2 - (1 \cdot Cy + dm)^2} - (Cx - dn)$ $1 \times 2 = \sqrt{(R-S)^2 - (2 \cdot Cy + \beta)^2 - (Cy + \beta)^2} - (Cx - \alpha)$ $= \sqrt{(R-S)^2 - (2 \cdot Cy + dm)^2} - (Cx - dn)$ $1 \times 3 = \sqrt{(R-S)^2 - (3 \cdot Cy + \beta)^2} - (Cx - \alpha)$ $= \sqrt{(R-S)^2 - (3 \cdot Cy + dm)^2} - (Cx - dn)$

. . .

In generation calculation is continued up to x$\mu$.

$1 \times \mu = \sqrt{(R-S)^2 - (\mu \cdot Cy + \beta)^2} - (Cx - \alpha)$ $= \sqrt{(R-S)^2 - (\mu \cdot Cy + dm)^2} - (Cx - dn)$ ④ Therefore, the formula (1) can be expressed as follows.

$$n1 = \sum_{k=1}^{\mu} \left[ \frac{\sqrt{(R-S)^2 - (kCy + dm)^2} - (Cx - dn)}{Cx} \right] \tag{1'}$$

Figure 10:
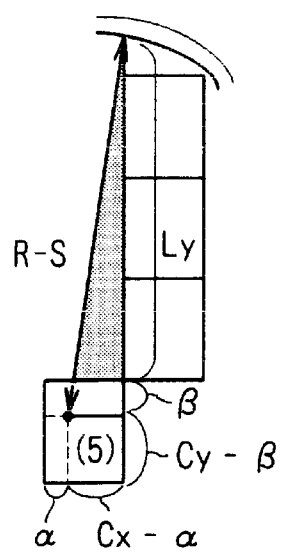
FIG. 10 is a diagram for explaining an example of yield calculation in the Y direction in the area (1) of FIGS. 7 and 8.
Figure 12:
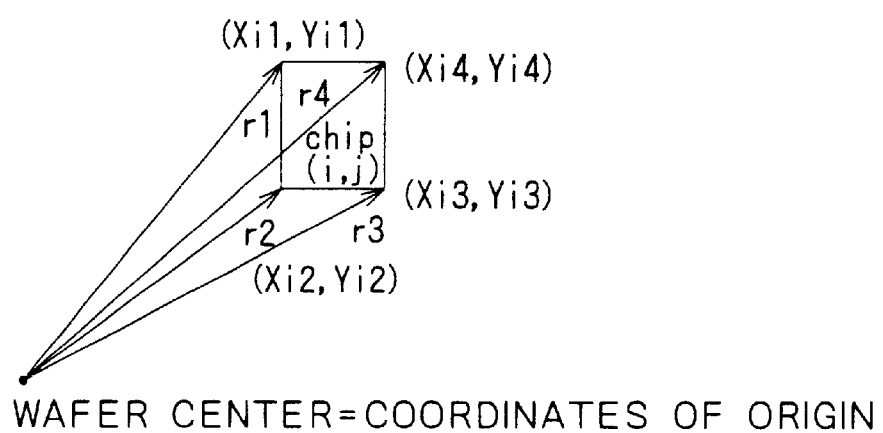
FIG. 12 is a diagram for explaining distance between the center coordinate and the four corners of chip.

⑤ Meanwhile, since $\mu$ of $\Sigma$ is a quotient obtained by dividing Ly of FIG. 10 with a chip size Cy, following result can be obtained.

$$\mu = \left[ \frac{Ly}{Cy} \right]$$

Moreover, since Ly is expressed as follows according to FIG. 9, $$Ly = \sqrt{(R-S)^2 - (Cx-\alpha)^2} - \beta$$

μ can be expressed as follows:

$$\mu = \left[\frac{\sqrt{(R-S)^2 - (Cx-dn)^2} - dm}{Cy}\right]$$

⑥ As indicated above, the number of chips included in the area 1 can be obtained from the known specifications m, n, d, R, S, Cx, Cy.

⑦ The number of chips of the other areas can also be obtained by the similar manner.

⑧ The number of chips of all areas is totaled to obtain the yield of the effective area.

CALCULATION EXAMPLE 2

When position of the chip including the wafer center is determined as shown in FIG. 11, the other chip can be uniquely and thoroughly arranged in the wafer with reference to this chip. Therefore, coordinates of the four corners of respective chip can also be determined uniquely. Whether the chip is within the effective area or not can be determined by searching (calculating) whether four corners are all within the effective area or not.

Figure 13:
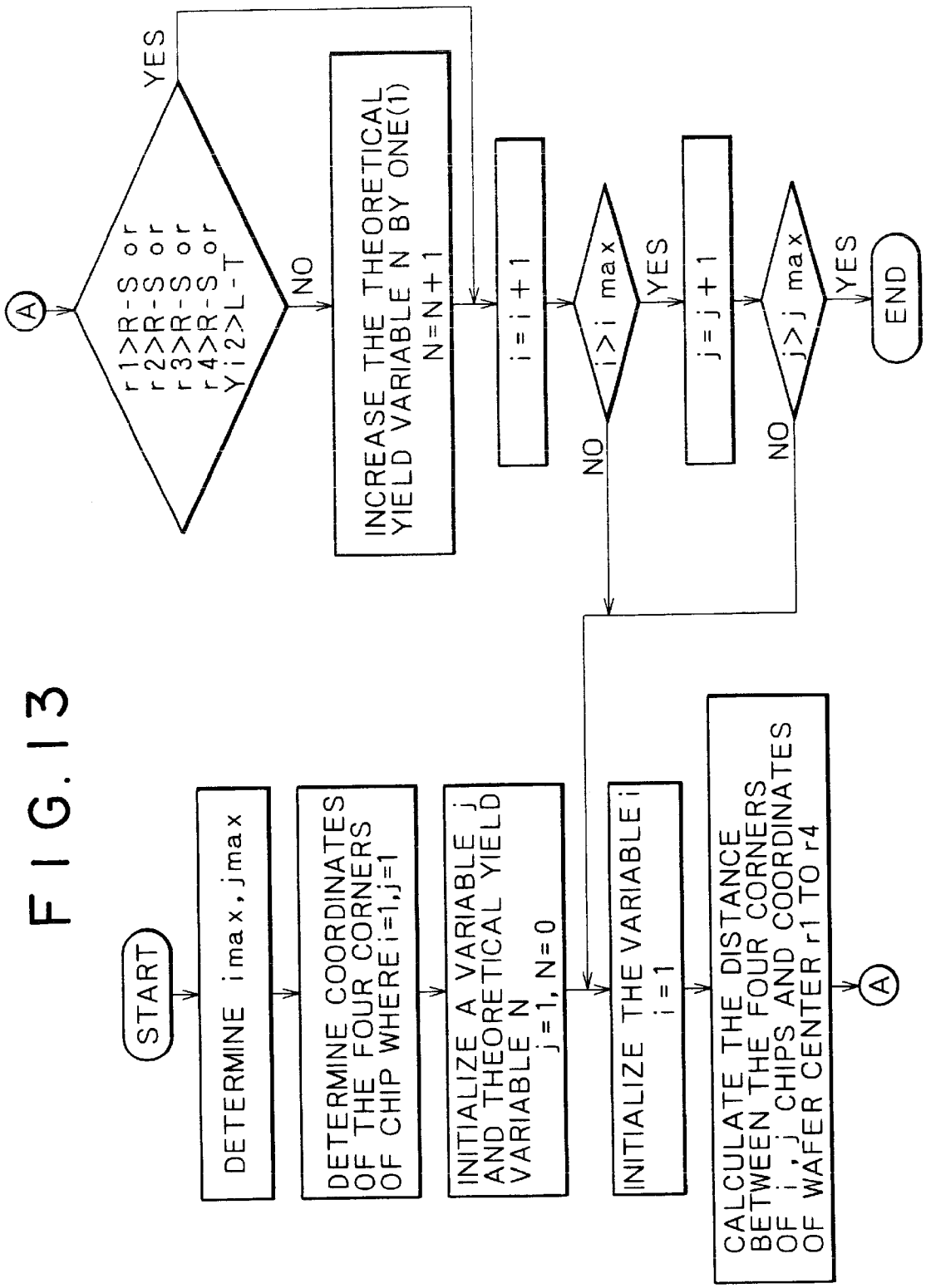
FIG. 13 is a flowchart diagram of the yield calculation.

All chips arranged uniquely are determined whether these are within the effective area or not and the chips within the area are counted up to obtain the yield of effective area. Flowchart of calculation for obtaining the yield is shown in FIG. 13.

Next, the virtual chip layout storing means 3 stores the chip layout condition depending on a plurality of relative positions between the wafer center and the chip including such wafer center and the theoretical yield obtained by the theoretical yield calculating function 2b based on such chip layout condition. As the storing method, the theoretical yield calculated by the virtual chip layout calculating means 2 is stored to each lattice point indicating the wafer center.

Figure 14:
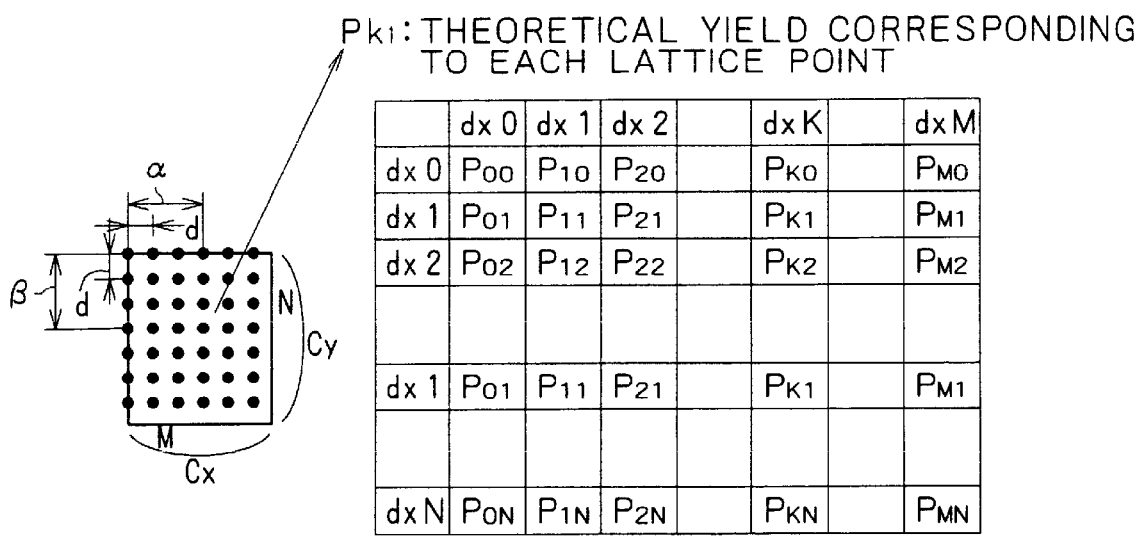
FIG. 14 is a diagram showing a storage image of a virtual chip layout storing means.

In more practical terms , a storage image in the storing means is indicated as shown in FIG. 14.

Next, the maximum theoretical yield layout determining means 4 retrieves and stores, as a process of the maximum theoretical yield layout determining means consisting of a series of processes by the maximum theoretical yield condition retrieving function 4a, the layout condition providing the maximum theoretical yield, namely a plurality of relative position data between the wafer center and chip including such wafer center providing the maximum theoretical yield from the theoretical yield obtained by the virtual chip layout calculating means and stored in the virtual chip layout storing means.

Subsequently, when there are a plurality of layout conditions providing the maximum theoretical yield retrieved and stored, the desired one is selected by the maximum theoretical yield condition selecting function 4b. In more practical terms, layout of a plurality of maximum theoretical yields stored is displayed on the display device and desired one is selected and it is then input. Image of this input interface is shown in FIG. 15.

Next, the virtual exposure layout calculating means 5 calculates, as a process of the virtual exposure layout calculation processing means consisting of a series of processes by the exposure layout calculating function 5a, the exposure layout condition in such a case that the wafer is virtually exposed by the semiconductor exposing device under the layout condition providing the maximum theoretical yield selected by the maximum theoretical yield condition selecting function 4b in the maximum theoretical yield layout determining means 4.

Figure 16A:
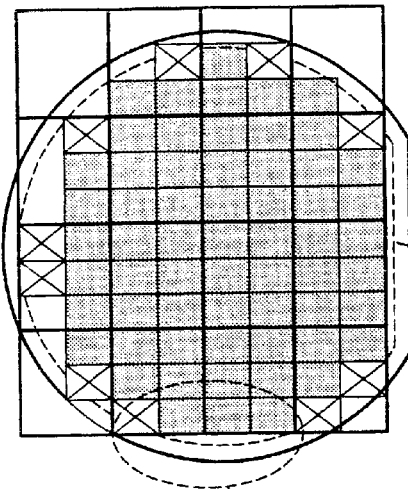
FIG. 16A and FIG. 16B are diagrams showing concept of the reference layout of the virtual exposure layout calculating means.
Figure 16B:
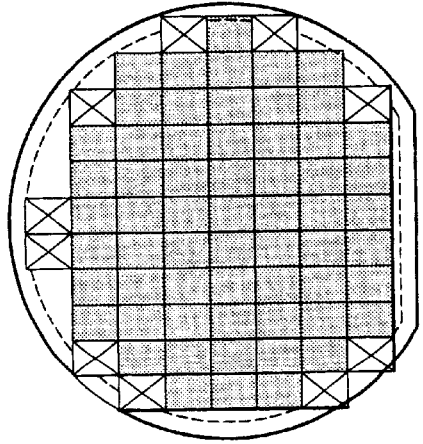

In more practical, all exposure layouts to realize chip layout providing the maximum theoretical yield are obtained and its number of times of exposure is calculated. For the chip layout providing the maximum theoretical yield determined by the maximum theoretical yield layout determining means 4, for example, shown in FIG. 16A, one exposure layout condition is determined by the chip layout in the exposing area defined by the initial data means 1 to cover all chips in the chip layout of FIG. 16A with reference to the orientation flat area shown in FIG. 16B. In this example, chips are arranged so that the left side of one or more extreme left side chips is matched with the left side of one or more extreme left side exposing areas (located on the same line).

With reference to the exposure layout condition determined as explained above, the exposure layout is shifted chip by chip to the left side along the orientation flat area as shown FIG. 17 and the new exposure layout is sequentially determined to cover all chips.

For each exposure layout condition, the number of times of exposure, namely the number of times of exposing area is calculated by the exposure number calculating function 5b. The flowchart of this exposure number calculation is shown in FIG. 18, FIG. 19 and FIG. 20.

Figure 19:
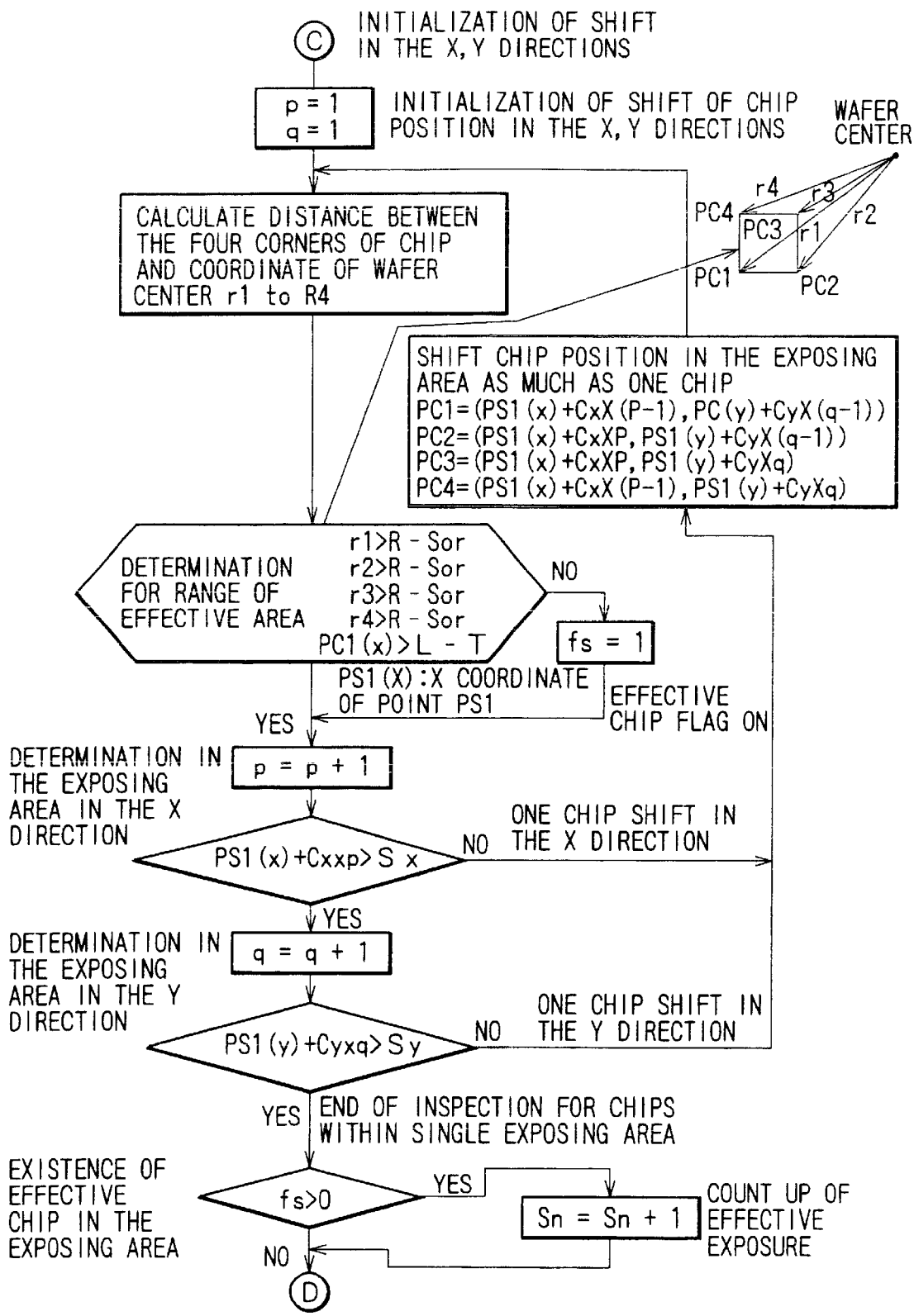
FIG. 19 is a flowchart for exposure number calculation of a plurality of exposure layouts in the virtual exposure layout calculating means and is also a diagram for explaining determination of effective chips in the exposure and exposure number counting process including the effective chips.
Figure 20:
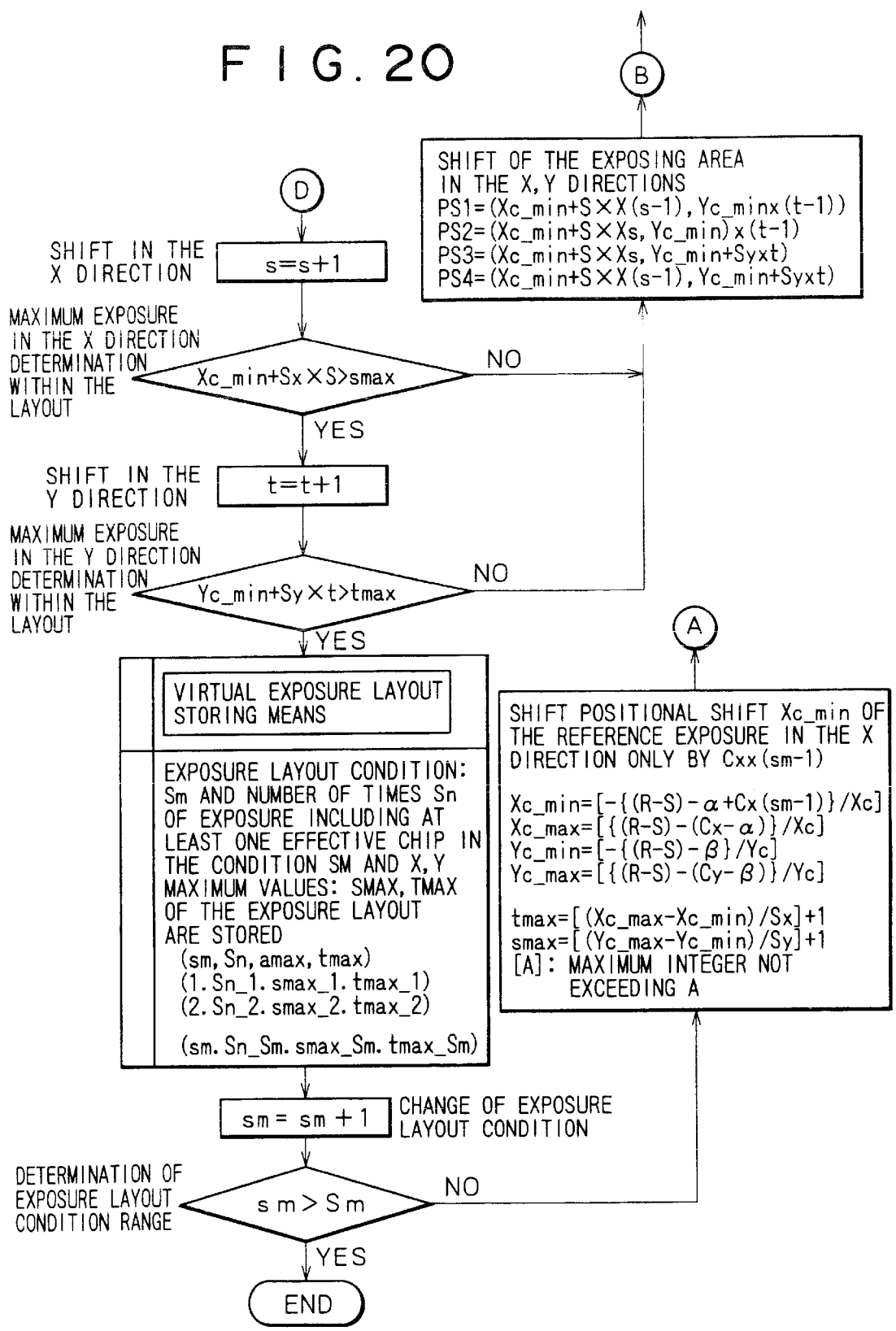
FIG. 20 is a flowchart for exposure number calculation of a plurality of exposure layouts in the virtual exposure layout calculating means and is also a diagram for explaining shift of the exposure area and the process for calculating and storing the exposure number including at least one or more effective chips.

Each symbol (specifications) used for the calculation in the flowchart of FIG. 18, FIG. 19 and FIG. 20 is assumed to be given, namely input or calculated in FIG. 21.

Next, the virtual exposure layout storing means 6 stores the exposure layout condition obtained by the exposure layout calculating function 5a and the number of times of exposure obtained for this condition by the exposure number calculating function 5b. As this storing method, a plurality of exposure layout conditions calculated by the virtual exposure layout calculating means 6 and the number of times of exposure corresponding to such conditions are all stored.

Next, the minimum exposure layout determining means 7 retrieves and stores, by the minimum exposure number condition retrieving function 7a as a process of the minimum exposure layout determination processing means consisting of a series of processes, the condition providing the minimum number of times of exposure from the exposure layout conditions obtained by the virtual exposure layout calculating means 5 and stored by the virtual exposure layout storing means 6. Subsequently, the minimum exposure number condition selecting function 7b selects the desired condition from a plurality of exposure layout conditions, when these are existing , providing the minimum number of times of exposure retrieved and stored. In more practical, the exposure layout of a plurality of minimum exposure numbers stored is displayed on the display device and only one desired layout is selected and then input. An image of this input interface is shown in FIG. 22.

Thereafter, the determined layout displaying means 8 determines and displays, by the determined layout displaying function 8a, as a process of the minimum exposure layout determination processing means consisting of a series of processes, the layout diagram overlapping the chip layout a providing the maximum theoretical yield selected and determined by the maximum theoretical yield layout determining means 4 and minimum exposure layout determining means 7 and the exposure layout providing the minimum number of times of exposure and also outputs and displays, by the exposing device specification displaying function 8b, the specification data required to realize the determined chip layout with the actual exposing device.

Here, the specification required to realize with the exposing device and method of calculating this specification will then be explained.

(1) Setting of exposure layout on the wafer of a general exposing device is made as explained below.

① Maximum arrangement of the exposure layout in the X, Y directions covering the wafer is determined, for example, as shown in FIG. 23A.

② As shown in FIG. 23B, the center of arrangement is determined depending on odd number and even number of the exposure layout number in the X and Y directions and this center is matched with the wafer center as the basic layout.

③ As shown in FIG. 23C, the exposing device can shift the wafer center and center of exposing layout for the basic layout and this is called the off-set in the X and Y directions.

(2) From item (1), the specification required for determining the exposing arrangement by the exposing device is as follow.

Figure 24:
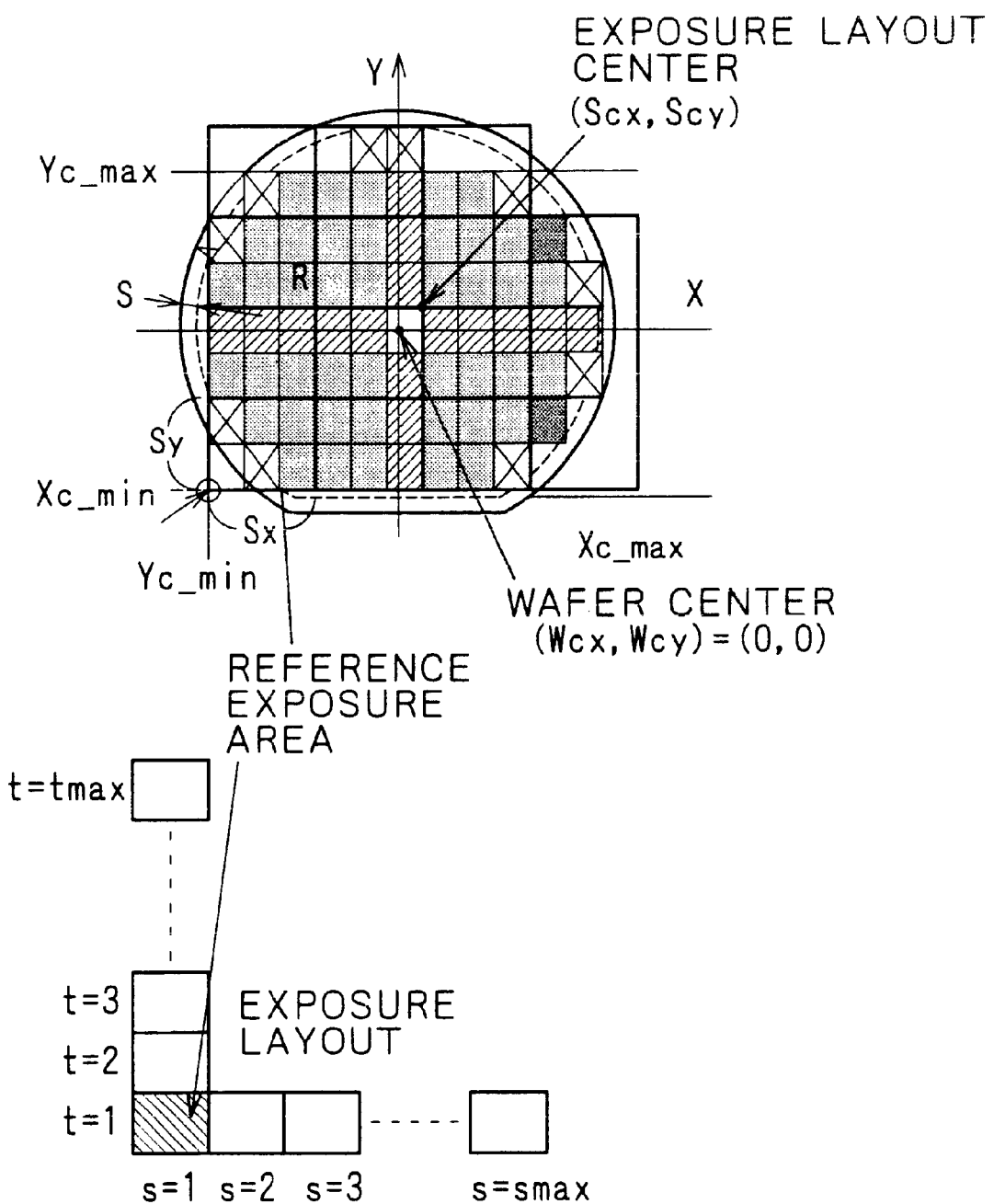
FIG. 24 is a diagram for explaining a way of obtaining the X and Y maximum values in the exposure layout.
Figure 25:
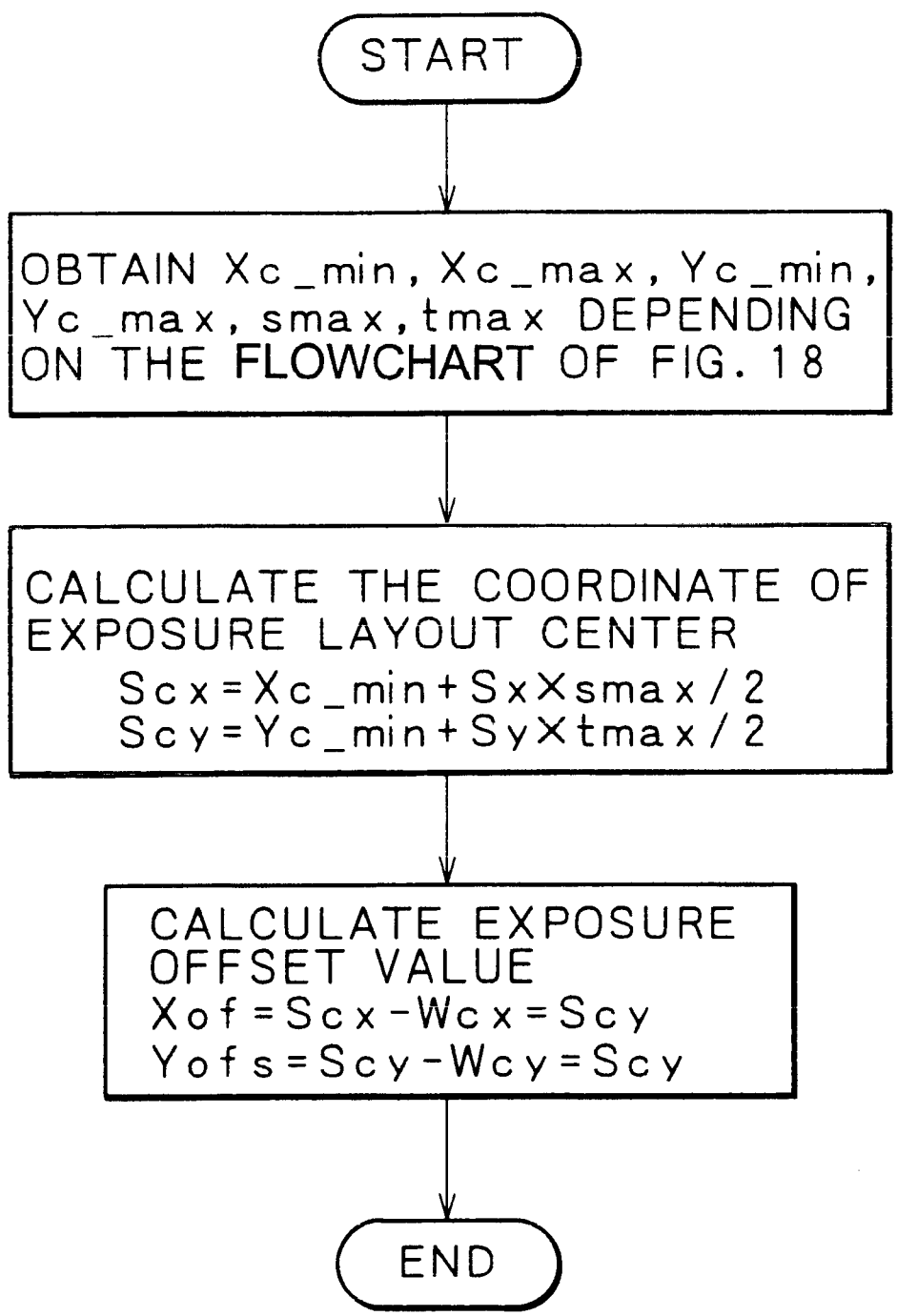
FIG. 25 is a flowchart to obtain the exposure offset.
Figure 27A:
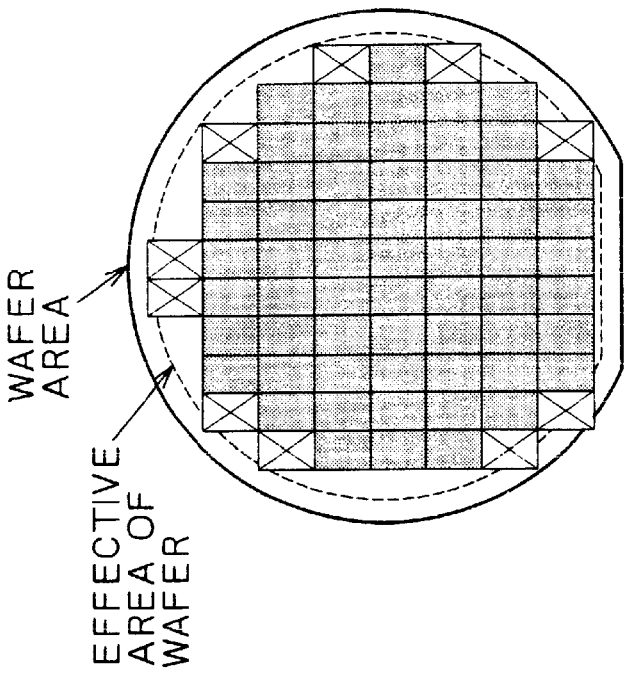
FIGS. 27A and 27B are diagrams showing practical examples of the theoretical yield.
Figure 27B:
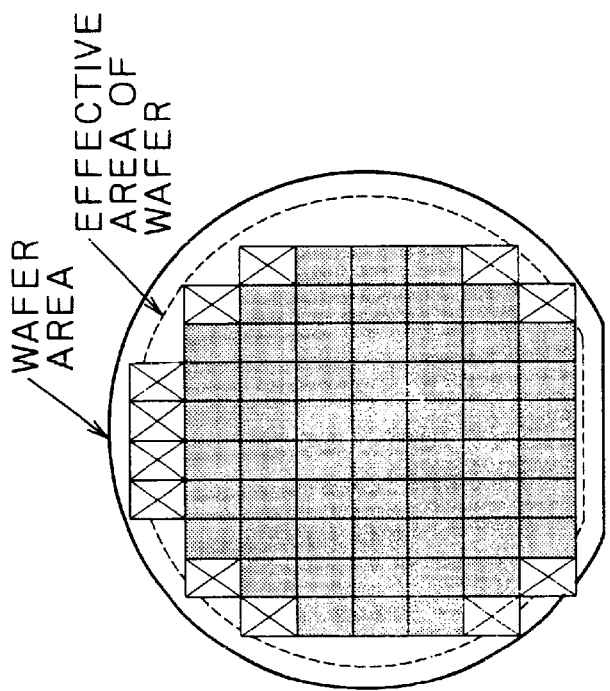
Figure 28A:
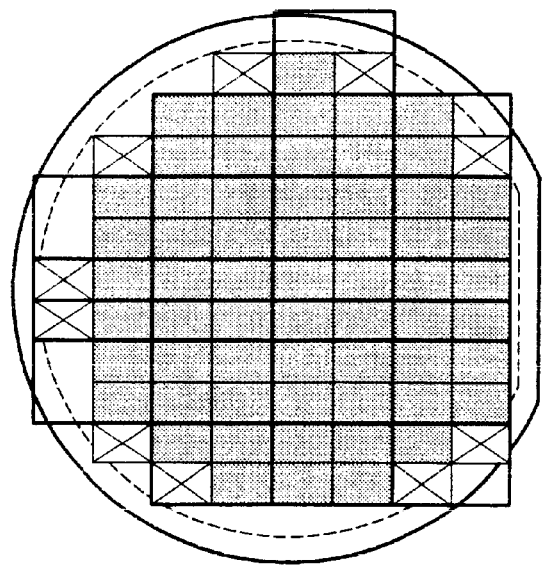
FIGS. 28A and 28B are diagrams showing practical examples of the theoretical yield and exposure number.
Figure 28B:
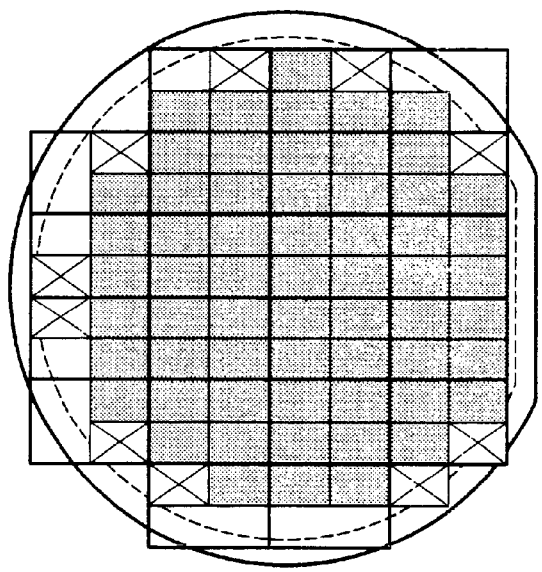

Kind of wafer (wafer size);
Exposing size;
 Maximum X, Y of the exposing arrangement
 Exposing offset (3) Specification of exposing device to realize the maximum theoretical yield and minimum exposure layout is obtained as indicated below. However, the maximum values of X, Y of the exposing arrangement are obtained on the basis of FIG. 24 and exposing offset is obtained on the basis of the flowchart of FIG. 25.

① Wafer size
 →wafer size stored in the initial data section 1
② Exposing size
 →Sx, Sy
③ Maximum values of X, Y of the exposing arrangement
 →smax, tmax
④ Exposing offset Moreover, as a practical means for outputting and displaying the specification data required to realize the determined chip layout with an exposing device, a computer display, printer, plotter, etc. and so forth can be selected adequately.

Here, FIG. 26 shows an output example of the calculation result for the maximum theoretical yield/minimum number of times of exposure by such an output means.

As described above, according to the automatic maximum theoretical yield calculating apparatus as an embodiment of the present invention, the maximum theoretical yield of chip can be calculated automatically by obtaining the chip layout to produce the maximum number of chips from the wafer in order to produce the chips from the wafer and the calculation result obtained can be output and displayed by automatically calculating the specification of the exposing device which can realize manufacture of chips with the minimum number of times of exposure.

As the preferred embodiment of the present invention, the automatic maximum theoretical yield calculating apparatus has been explained, but the present invention is not limited thereto and it is also possible to consider a computer-readable recording medium which is storing a program which is formed to totally execute the automatic calculation of the maximum theoretical yield with a computer by including the processing programs, as the structural elements, to execute the operations of each structural element of this apparatus.

As explained above, the present invention determines, by the automatic calculation, the chip layout method which assures maximum theoretical yields for a wafer and minimum exposing work time by the exposing device, namely assures maximum number of chips to be arranged in the effective range of the wafer and minimum number of times of exposure by the exposing device and obtains the specification required to realize the determined layout with the semiconductor exposing device. Accordingly, low cost manufacture per chip by the maximum yield can be realized and moreover the exposing process which is generally repeated for many times in the semiconductor wafer manufacturing process can be conducted most effectively.

What is claimed is:

1. An automatic maximum theoretical yield calculating apparatus for automatically calculating a maximum theoretical yield of chips by obtaining a chip layout to produce a maximum number of chips from a wafer in order to manufacture the chips from the wafer and also automatically calculating a specification of an exposing device to realize manufacture of chips with a minimum number of times of exposure, comprising:

initial data means including a wafer shape specification storing function for storing specification to determine the shape of wafers in a plurality of sizes, a wafer effective area specification inputting/storing function for storing input specification when the specification to determine the shape of effective area for determining the chip manufacturing range on the wafer is input, a chip size specification inputting/storing function for storing the input specification when the specification to determine sizes of chips to be arranged is input, and an exposing size specification inputting/storing function for storing the input specification when the specification to determine the size of one,exposing range and the number of chips to be arranged within the range is input;

virtual chip layout calculating means including a chip layout calculating function to execute the calculation to determine the virtual chip layout within the effective area under the chip layout condition depending on a plurality of relative positions between the wafer center and chip including this wafer center based on the wafer shape and shape of effective area obtained from the specification to determine the wafer shape and the specification to determine the shape of effective area stored in said initial data means, and a theoretical yield calculating function to calculate the number of chips providing the theoretical yield arranged within the effective area of the chip layout obtained by the chip layout calculating function;

virtual chip layout storing means for storing chip layout condition depending on a plurality of relative positions between said wafer center and chip including said wafer center and the theoretical yield obtained by said theoretical yield calculating function based on said condition;

maximum theoretical yield layout determining means including a maximum theoretical yield condition retrieving function to retrieve and store the layout condition providing the maximum theoretical yield from the theoretical yield obtained by said virtual chip layout calculating means and stored in the virtual chip layout storing means, and a maximum theoretical yield condition selecting function to select the desired layout condition from a plurality of layout conditions, when the desired layout condition existed, providing the maximum theoretical yield retrieved and stored;

virtual exposure layout calculating means including an exposure layout calculating function to calculate the exposure layout conditions in such a case that a wafer is virtually exposed with a semiconductor exposing device under the layout condition providing the maximum theoretical yield selected by the maximum theoretical yield condition selecting function of said maximum theoretical yield layout determining means and the exposure number calculating function to calculate the number of times of exposure for the obtained exposure layout condition;

virtual exposure layout storing means for storing the exposure layout condition obtained by said exposure layout calculating function and the number of times of exposure obtained by said exposure number calculating function;

minimum exposure layout determining means including a minimum exposure number condition retrieving function to retrieve and store the condition providing the minimum number of times of exposure from the exposure layout condition obtained by said virtual exposure layout calculating means and stored in the virtual exposure layout storing means, and a minimum exposure number condition selecting function to select the desired condition from a plurality of exposure layout conditions, when there are, providing the minimum number of times of exposure retrieved and stored; and determined layout displaying means including a determined layout displaying function to determine and display the layout diagram overlapping the chip layout providing the maximum theoretical yield selected and determined by said maximum theoretical yield layout determining means and minimum exposure layout determining means and the exposing layout providing the minimum number of times of exposure, and an exposing device specification displaying function to display the specification data required to reproduce the determined chip layout with the actual exposing device.

2. A computer-readable recording medium storing a program to execute automatic calculation of a maximum theoretical yield with a computer for automatically calculating a maximum theoretical yield of chips by obtaining a chip layout to produce a maximum number of chips from a wafer in order to manufacture the chips from the wafer and also automatically calculating a specification of an exposing device to realize manufacture of chips with a minimum number of times of exposure, comprising:

initial data processing means consisting of a wafer shape specification storing process for storing specification to determine the wafer shape in a plurality of sizes, a wafer effective area specification inputting/storing process for storing an input specification when the specification to determine the shape of effective area to determine the chip manufacturing range on the wafer, a chip size specification inputting/storing process for storing an input specification when the specification to determine the sizes of chips to be arranged is input, and an exposing size specification inputting/storing process for storing an input specification when the specification to determine the size of one exposing range and the number of chips within this range is input;

virtual chip layout calculation processing means consisting of a chip layout calculation process for calculating to determine the virtual chip layout in said effective area under the chip layout condition depending on a plurality of relative positions between the wafer center and a chip including this wafer center based on the wafer shape and shape of effective area obtained from the specification to determine the shape of wafer and the specification to determine the shape of effective area stored in said initial data means, and a theoretical yield calculation process to calculate the number of chips providing the theoretical yield arranged in the effective area in the chip layout obtained by the chip layout calculating function;

virtual chip layout storage processing means for storing the chip layout condition depending on a plurality of relative positions between said wafer center and the chip including such wafer center and the theoretical yield obtained by said theoretical yield calculation process based on said condition;

maximum theoretical yield layout determination processing means consisting of a maximum theoretical yield condition retrieval process for retrieving and storing the layout condition providing the maximum theoretical yield from the theoretical yields obtained by said virtual chip layout calculation processing means and stored in said virtual chip layout storage processing means, and a maximum theoretical yield condition selection process for selecting the desired layout condition from a plurality of layout conditions, when the desired layout condition existed, providing the maximum theoretical yield retrieved and stored;

virtual exposure layout calculation processing means consisting of an exposure layout calculation process to calculate the exposure layout condition when a wafer is virtually exposed by a semiconductor exposing device under the layout condition providing the maximum theoretical yield selected by the maximum theoretical yield condition selecting process of said maximum theoretical yield layout determination processing means and the exposure number calculation process to calculate the number of times of exposure for the obtained exposure layout condition;

virtual exposure layout storage processing means for storing the exposure layout condition obtained by said exposure layout calculation process and the number of times of exposure obtained by said exposure number calculation process for said condition;

minimum exposure layout determination processing means consisting of a maximum exposure number condition retrieval process for retrieving and storing the condition providing the minimum number of times of exposure from the exposure layout conditions obtained by said virtual exposure layout calculation processing means and stored in the virtual exposure layout storage processing means, and a minimum exposure number condition selecting process for selecting the desired condition from a plurality of exposure layout conditions, when there are, providing the minimum number of times of exposure retrieved and stored; and determined layout display processing means consisting of the determined layout displaying process for determining and displaying the layout diagram overlapping the chip layout providing the maximum theoretical yield selected and determined by said maximum theoretical yield layout determination processing means and minimum exposure layout determination processing means and the exposure layout providing the minimum number of times of exposure, and an exposing device specification display process for displaying the specification data required to reproduce the determined chip layout with the actual exposing device.

* * * * *